(12) United States Patent
Kim et al.

(10) Patent No.: US 9,837,422 B2
(45) Date of Patent: Dec. 5, 2017

(54) METHOD FOR FORMING BURIED BIT LINE, SEMICONDUCTOR DEVICE HAVING THE SAME, AND FABRICATING METHOD THEREOF

(71) Applicant: SK hynix Inc., Gyeonggi-do (KR)

(72) Inventors: You-Song Kim, Gyeonggi-do (KR); Jin-Ki Jung, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/179,809

(22) Filed: Jun. 10, 2016

(65) Prior Publication Data

US 2016/0284710 A1   Sep. 29, 2016

Related U.S. Application Data

(62) Division of application No. 13/446,315, filed on Apr. 13, 2012, now abandoned.

(30) Foreign Application Priority Data

Dec. 9, 2011   (KR) .................. 10-2011-0132045

(51) Int. Cl.
  *H01L 27/108* (2006.01)
  *H01L 21/311* (2006.01)
  *H01L 21/3205* (2006.01)
  *H01L 21/764* (2006.01)

(52) U.S. Cl.
  CPC .. *H01L 27/10885* (2013.01); *H01L 21/31111* (2013.01); *H01L 21/32053* (2013.01); *H01L 21/764* (2013.01); *H01L 27/1085* (2013.01); *H01L 27/10891* (2013.01)

(58) Field of Classification Search
  CPC .................. H01L 27/10885; H01L 21/764
  See application file for complete search history.

(56) References Cited

U.S. PATENT DOCUMENTS

| 2001/0051423 | A1 | 12/2001 | Kim et al. | |
|---|---|---|---|---|
| 2010/0090348 | A1 | 4/2010 | Park et al. | |
| 2010/0148233 | A1* | 6/2010 | Fujimoto | H01L 27/108 257/296 |
| 2011/0278654 | A1* | 11/2011 | Ueda | H01L 21/764 257/296 |

FOREIGN PATENT DOCUMENTS

| CN | 1930686 | 3/2007 |
|---|---|---|
| CN | 102082117 | 6/2011 |
| CN | 102104005 | 6/2011 |

OTHER PUBLICATIONS

Office Action issued by the State Intellectual Property Office (China Patent Office) dated May 5, 20126.
Patent Certificate and Publication of Granted Chinese invention of a counterpart foreign application issued by the Chinese Patent Office dated Apr. 12, 2017.

* cited by examiner

*Primary Examiner* — Stephen Bradley
(74) *Attorney, Agent, or Firm* — IP & T Group LLP

(57) ABSTRACT

A method for fabricating a semiconductor device includes: etching a semiconductor substrate and forming a plurality of bodies separated from one another by a plurality of trenches; forming a protective layer with open parts to expose both sidewalls of each of the bodies; forming buried bit lines in the bodies by silicidizing exposed portions of the bodies through the open parts; and forming a dielectric layer to gap-fill the trenches and define air gaps between adjacent buried bit lines.

5 Claims, 25 Drawing Sheets

METHOD FOR FORMING BURIED BIT LINE, SEMICONDUCTOR DEVICE HAVING THE SAME, AND FABRICATING METHOD THEREOF

CROSS-REFERENCE TO RELATED APPLICATIONS

This application is a division of U.S. patent application Ser. No. 13/446,315 filed on Apr. 13, 2012, which claims priority of Korean Patent Application No. 10-2011-0132045, filed on Dec. 9, 2011. The disclosure of each of the foregoing application is incorporated herein by reference in its entirety.

BACKGROUND

1. Field

Exemplary embodiments of the present invention relate to a semiconductor device, and more particularly, to a semiconductor device having a buried bit line and a fabricating method thereof.

2. Description of the Related Art

Most semiconductor devices include transistors. For example, in a memory device such as a DRAM, a memory cell includes a MOSFET. In general, in a MOSFET, source/drain regions are formed at the surface of a semiconductor substrate, and with such an arrangement, a planar channel is formed between the source region and the drain region. Such a general MOSFET is referred to as a planar channel transistor.

As advancements in integration and performance for a memory device are being made, MOSFET fabrication is reaching physical limits. For example, as the size of a memory cell shrinks, the size of a MOSFET such as the channel length thereof shrinks. If the channel length of a MOSFET is shortened, data maintaining properties are likely to deteriorate.

To address the above discussed features, a vertical channel transistor has been suggested in the art. In the vertical channel transistor (VCT), a source region and a drain region are formed on respective ends of a pillar. Any one of the source region and the drain region may be connected with a bit line. The bit line is formed by being buried in a trench defined between pillars, and accordingly, is referred to as a buried bit line (BBL).

Two memory cells each including a vertical channel transistor (VCT) and a buried bit line (BBL) are adjacent to one buried bit line (BBL). Therefore, the buried bit line (BBL) is formed in a space (trench) between cells, and an OSC (one-side-contact) process is performed to connect one cell with one buried bit line (BBL). The OSC process is a process for allowing each buried bit line (BBL) to be brought into contact with any one of two adjacent cells. Thus, the OSC process is also referred to as a single-side-contact (SSC) process. Generally, in a memory device such as a DRAM which adopts a planar channel transistor, in order to connect a planar channel transistor with a bit line, a contact plug process with a high aspect ratio is used. Conversely, in the case of adopting a vertical channel transistor and a buried bit line, since the vertical channel transistor and the buried bit line may be brought into direct contact with each other, a contact plug process is not necessary. Hence, because it is not necessary to connect a contact plug, the parasitic capacitance of the bit line may be reduced.

FIG. 1 is a cross-sectional view illustrating a buried bit line formed according to the conventional art.

Referring to FIG. 1, a plurality of bodies 14, which are separated by trenches 13, are formed on a semiconductor substrate 11. The bodies 14 are formed through etching using a hard mask layer 12. A protective layer 15 is formed on the sidewalls of the bodies 14 and on the surfaces of the trenches 13. Open parts 17 are defined in the protective layer 15 through an OSC process. Each open part 17 opens any one sidewall of each body 14. Buried bit lines 16 are formed to partially fill the trenches 13. The buried bit lines 16 are connected with the bodies 14 through the open parts 17. Each buried bit line 16 is connected with any one of two adjacent bodies 14. While not shown in the drawing, the upper portion of each body 14 includes a pillar in which source/drain regions and a channel of a vertical channel transistor are formed.

As can be seen from FIG. 1, in order to connect each buried bit line 16 to the sidewall of any one of the adjacent bodies 14, an OSC process is adopted. In order to realize the OSC process, various methods such as a liner layer and a tilt ion implantation process, an OSC mask process and the like have been proposed.

However, these methods fail to form a uniform and reproducible OSC structure due to difficulties in manufacturing processes. Also, as high integration of memory devices continue, the distance between adjacent buried bit lines 16 becomes narrow and parasitic capacitance $C_B$ between adjacent buried bit lines 16 increases. Since the buried bit lines 16 are brought into contact with the bodies 14, the parasitic capacitance $C_B$ between buried bit lines 16 is substantially capacitance between the body 14 and the buried bit line 16. Accordingly, because the distance between adjacent buried bit lines 16 becomes smaller, the parasitic capacitance $C_B$ increases significantly.

As the parasitic capacitance $C_B$ between buried bit lines increases, the normal operation of a device becomes difficult to obtain.

SUMMARY

Embodiments of the present invention are directed to a method for forming a buried bit line which can reduce the parasitic capacitance between adjacent buried bit lines, a semiconductor device having the same, and a fabricating method thereof.

In accordance with an embodiment of the present invention, a method for fabricating a semiconductor device includes: etching a semiconductor substrate and forming a plurality of bodies separated from one another by a plurality of trenches; forming a protective layer with open parts to expose both sidewalk of each of the bodies; forming buried bit lines in the bodies by silicidizing exposed portions of the bodies through the open parts; and forming a dielectric layer to gap-fill the trenches and define air gaps between adjacent buried bit lines.

In accordance with another embodiment of the present invention, a method for fabricating a semiconductor device includes: etching a semiconductor substrate and forming bodies; forming a protective layer with open parts to expose both sidewalls each of the bodies; and forming buried bit lines in the bodies by silicidizing the exposed portions of the bodies through the open parts.

In accordance with another embodiment of the present invention, a method for fabricating a semiconductor device includes: forming a body structure having bodies that include first body portions, second body portions positioned under the first body portions and third body portions positioned under the second body portions, and a protective layer having open portions to expose both sidewalls of the second body portions; and forming buried bit lines by silicidizing the second body portions exposed by the open parts.

In accordance with another embodiment of the present invention, a method for fabricating a semiconductor device includes: forming a plurality of silicon bodies by etching a silicon-containing substance; forming a protective layer having open parts to open both sidewalls of each of the silicon bodies; forming a metal-containing layer to come into contact with exposed regions of each of the silicon bodies through the open parts; and forming buried conductors by causing a reaction of the metal-containing layer with the exposed regions to silicidize the exposed regions.

In accordance with another embodiment of the present invention, a method for fabricating a semiconductor device includes: forming bodies by etching a semiconductor substrate; forming a protective layer having open parts to expose both sidewalls of each of the bodies; forming buried bit lines in the bodies by silicidizing exposed portions of the bodies through the open parts; forming a plurality of pillars by etching the bodies over the buried bit lines; forming word lines on sidewalls of the pillars; and forming capacitors connected to upper parts of the pillars.

In accordance with another embodiment of the present invention, a method for forming a buried bit line includes: forming a body structure having bodies that include first body portions, second body portions positioned under the first body portions and third body portions positioned under the second body portions, and a protective layer with open parts to expose both sidewalls of each of the second body portions; forming buried bit lines by silicidizing the exposed second body portions through the open parts; forming a plurality of pillars by etching the first body portions over the buried bit lines; forming word lines on sidewalls of the pillars; and forming capacitors connected to upper parts of the pillars.

In accordance with yet another embodiment of the present invention, a semiconductor device includes: a plurality of bodies formed on a semiconductor substrate to be separated from one another by a plurality of trenches; a plurality of bit lines including a metal silicide buried in the bodies; and a dielectric layer filled in the trenches to provide air gaps between adjacent bit lines.

In accordance with yet another embodiment of the present invention, a semiconductor device includes: a plurality of bodies formed to be separated from one another by a plurality of trenches; a plurality of vertical channel transistors including a plurality of pillars that are vertically formed on the bodies; and a plurality of bit lines including a metal silicide that is connected with lower parts of the pillars and is buried in the bodies.

In accordance with still another embodiment of the present invention, memory cells include: a plurality of linear silicon bodies formed to be separated from one another by a plurality of trenches; a plurality of vertical channel transistors including a plurality of silicon pillars that are vertically formed on the linear silicon bodies; a plurality of bit lines including a metal silicide that is connected with lower parts of the silicon pillars and is buried in the linear silicon bodies; a dielectric layer filled in the trenches to provide air gaps between adjacent bit lines; a plurality of word lines formed on sidewalls of the silicon pillars to extend in a direction perpendicular to the bit lines; and a plurality of capacitors connected to upper parts of the silicon pillars.

In accordance with still another embodiment of the present invention, memory cells includes: a plurality of bodies formed to be separated from one another by a plurality of trenches; a plurality of vertical channel transistors including a plurality of pillars that are vertically formed on the bodies; a plurality of bit lines including a metal silicide that is connected with lower parts of the pillars and is buried in the bodies; a plurality of word lines formed on sidewalls of the pillars to extend in a direction perpendicular to the bit lines; and a plurality of capacitors connected to upper parts of the pillars.

DETAILED DESCRIPTION

Figure 1:
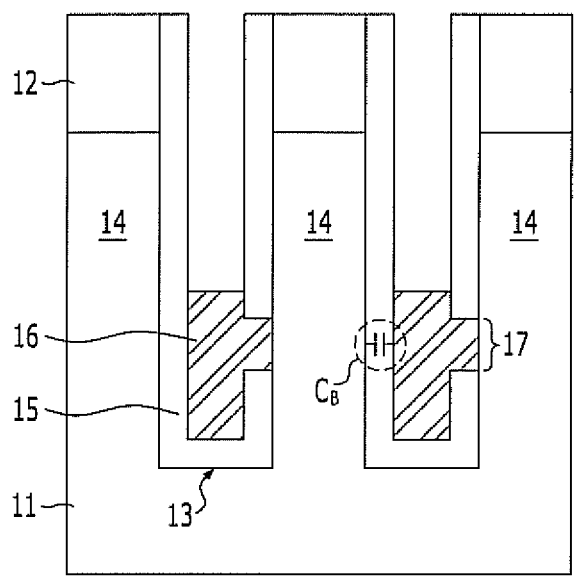
FIG. 1 is a cross-sectional view illustrating a buried bit line formed according to the conventional art.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2A:
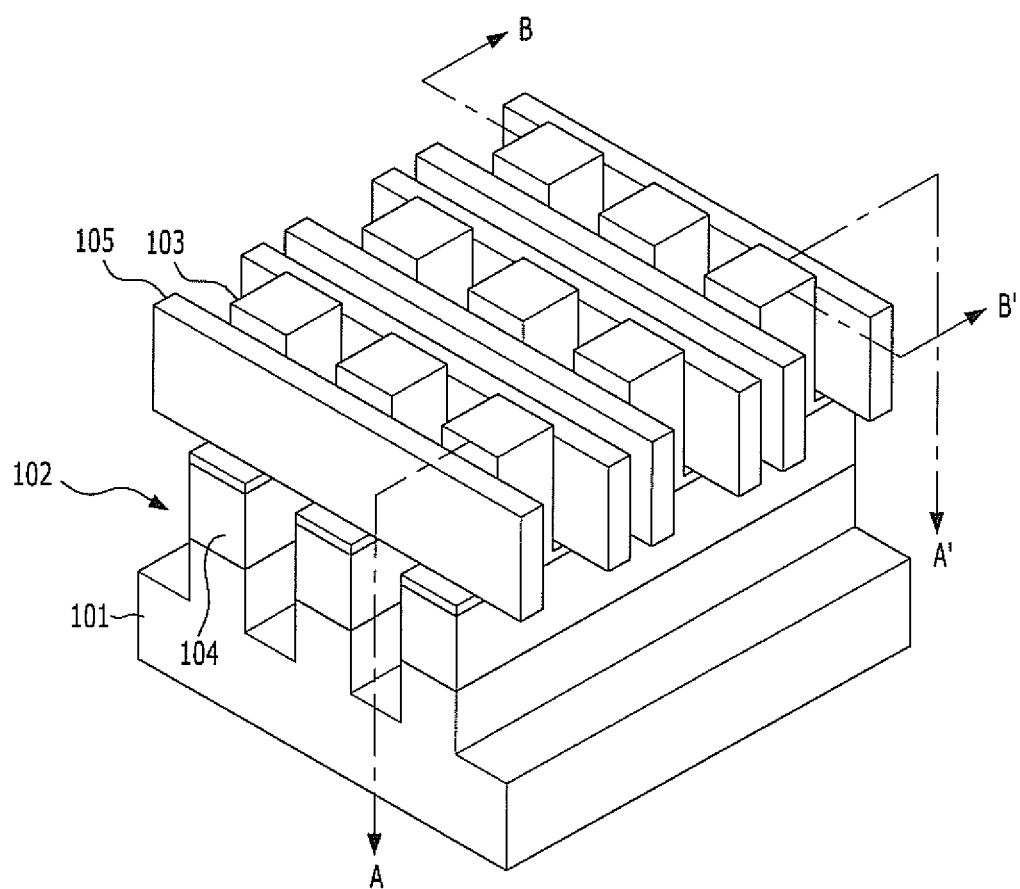
FIGS. 2A and 2B are perspective views showing semiconductor devices having a buried bit line in accordance with embodiments of the present invention.
Figure 2B:
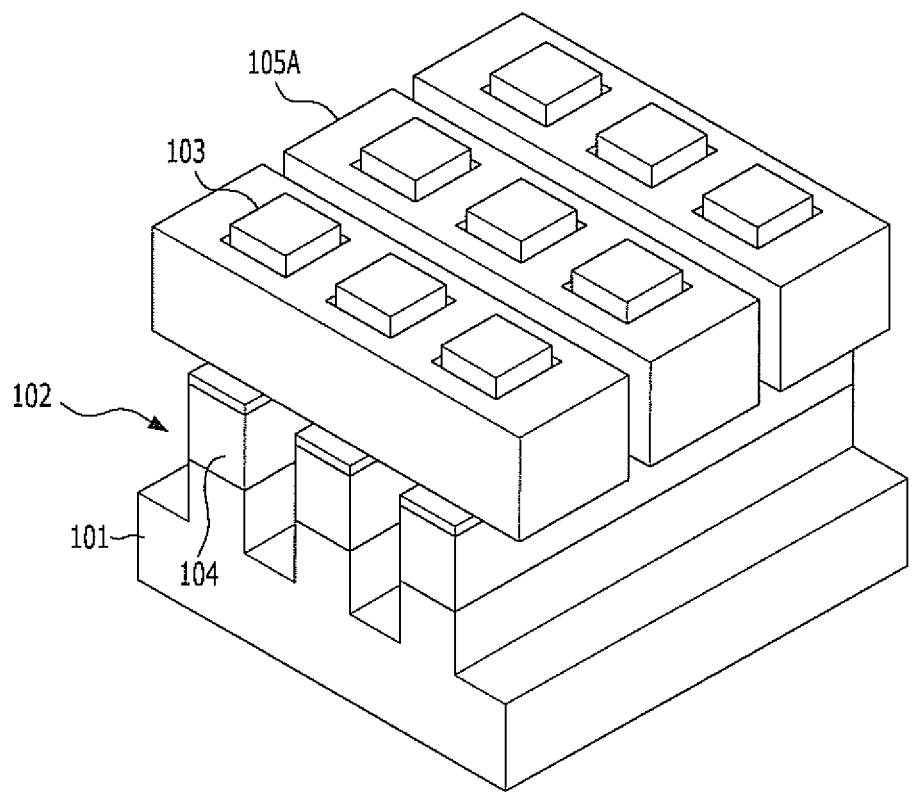
Figure 3A:
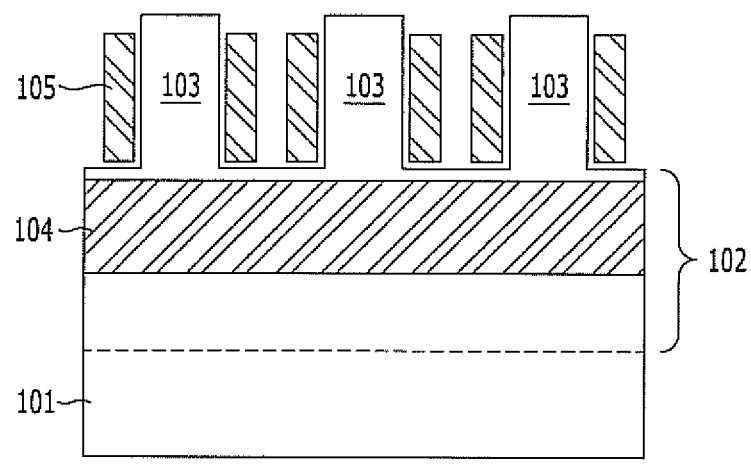
FIG. 3A is a cross-sectional view taken along the line A-A' of FIG. 2A.
Figure 3B:
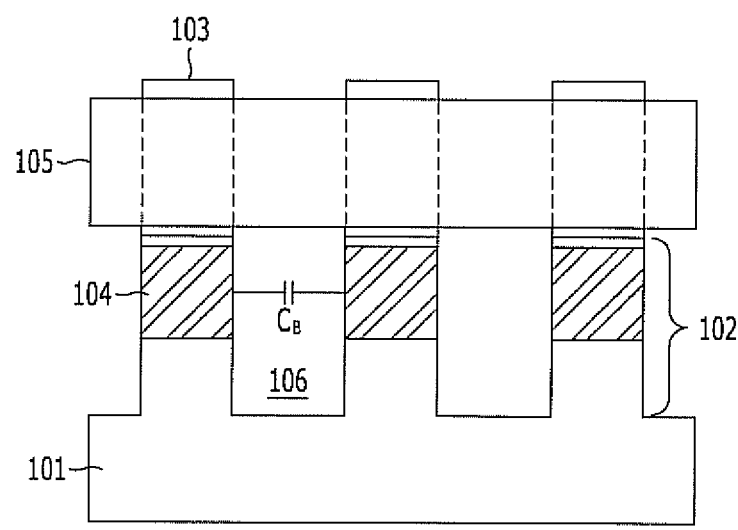
FIG. 3B is a cross-sectional view taken along the line B-B' of FIG. 2A.

FIGS. 2A and 2B are perspective views showing semiconductor devices having a buried bit line in accordance with embodiments of the present invention. FIG. 3A is a cross-sectional view taken along the line A-A' of FIG. 2A, and FIG. 3B is a cross-sectional view taken along the line B-B' of FIG. 2A.

Referring to FIGS. 2A, 2B, 3A and 3B, a semiconductor device includes buried bit lines 104, pillars 103 and word lines 105. A plurality of bodies 102 and a plurality of pillars 103 are formed on a semiconductor substrate 101. The semiconductor substrate 101, the bodies 102 and the pillars 103 may be provided integrally with one another. In embodiments, the semiconductor substrate 101, the bodies 102 and the pillars 103 may be distinguished from one another by etching a silicon-containing substance. The plurality of pillars 103 are formed on the respective bodies 102. That is to say, a plurality of pillars 103 are formed on each body 102. The plurality of bodies 102 are formed to extend in one direction on the semiconductor substrate 101 and are separated from one another. Each body 102 has a linear form. The bodies 102 may be formed in the vertical direction on the semiconductor substrate 101, and the pillars 103 may be formed in the vertical direction on the bodies 102. For example, the semiconductor substrate 101 and the bodies 102 may be orthogonal to each other, and the bodies 102 and the pillars 103 may be orthogonal to each other. The plurality of pillars 103 are formed on the bodies 102 to be separated from one another. The plurality of pillars 103 may have the layout of an array.

The semiconductor substrate 101 includes a silicon-containing substance. For example, the semiconductor substrate 101 may include a silicon substrate, a silicon germanium substrate, or an SOI (silicon on insulator) substrate. Because the bodies 102, the pillars 103 and the semiconductor substrate 101 may include the same substance, the bodies 102 and the pillars 103 include a silicon-containing substance. The bodies 102 and the pillars 103 each include silicon or silicon germanium.

Each pillar 103 has a structure in which source/drain regions and a channel region of a vertical channel transistor are formed. For example, each pillar 103 may include a first source/drain region, a second source/drain region and a vertical channel region. Any one of the first source/drain region and the second source/drain region may be connected with a respective buried bit line 104. The other of the first source/drain region and the second source/drain region may be connected with a capacitor. The first source/drain region, the vertical channel region and the second source/drain region may be connected with one another in the vertical direction. The first source/drain region and the second source/drain region may each form an NPN junction or a PNP junction with the vertical channel region. For example, in the case where the first source/drain region and the second source/drain region are doped with impurities of a first conductivity type, the vertical channel region may be doped with impurities of a second conductivity type opposite to the first conductivity type. Here, when the impurities of the first conductivity type are N type impurities, the impurities of the second conductivity type include P type impurities and vice versa. In the event that the vertical channel transistor is an NMOSFET, the first source/drain region, the vertical channel region and the second source/drain region may form an NPN junction.

The buried bit lines 104 are formed in the bodies 102. Accordingly, the buried bit lines 104 may extend in a first direction. The buried bit lines 104 include a metallic substance. The buried bit lines 104 may include a metal silicide. The metal silicide is a substance of which resistance is lower than that of polysilicon. With such substance, the buried bit lines 104 have low resistance. The buried bit lines 104 may be formed through a silicidation process. Further, the buried bit lines 104 may be formed through a full silicidation process. The full silicidation process is a process for fully silicidizing a silicon-containing substance to the desired depth. The buried bit lines 104 may be formed using a near-noble metal such as a titanium silicide ($TiSi_x$), a tungsten silicide ($WSi_x$), a cobalt silicide ($CoSi_x$) and a nickel silicide ($NiSi_x$) or a metal silicide such as a refractory metal. The metal silicide may be obtained by forming a conductive layer through a sputtering process, a chemical vapor deposition (CVD) process or an atomic layer deposition (ALD) process and then performing a silicidation process. The conductive layer may include a near-noble metal or a refractory metal. Adjacent buried bit lines 104 are separated from each other by the trench 106. While not shown in the drawings, a dielectric layer may be filled in the trench 106 between adjacent buried bit lines 104. According to an example, a dielectric layer with an air gap may be filled. According to another example, the dielectric layer may include an oxide.

The word lines 105 are formed on the sidewalls of the pillars 103 to extend vertically on the sidewalls of the pillars 103. Thus, the word lines 105 are referred to as vertical word lines. Since the word lines 105 are formed on both sidewalls of the pillars 103, a double word line structure may be formed. In forming the double word line structure, ends of the respective word lines may be connected with each other. Since the pillars 103 serve as regions where channels are formed, vertical channels are formed by the word lines 105. With the above-described arrangement, vertical channel transistors each including a first source/drain, a vertical channel and a second source/drain are formed. The word lines 105 may extend in a second direction perpendicular to the first direction (that is, the extending direction of the buried bit lines 104). The word lines 105 include a metallic substance. The word lines 105 may include a titanium nitride (TiN) or a stack (WN/W) of a tungsten nitride layer and a tungsten layer. The word lines 105 and the buried bit lines 104 may be formed to be separated from each other. To this end, a dielectric substance may be additionally formed between the word lines 105 and the buried bit lines 104. The dielectric substance may include a silicon oxide or any other reasonably suitable dielectric substance. According to an example shown in FIG. 2B, the word lines 105 may extend in the second direction perpendicular to the first direction (the extending direction of the buried bit lines 104) while surrounding the pillars 103.

As described above, the buried bit lines 104 are formed in the bodies 102. Accordingly, adjacent buried bit lines 104 are sufficiently separated from one another by the trenches 106 to thus reduce parasitic capacitance $C_B$ between adjacent bit lines 104.

Figure 4A:
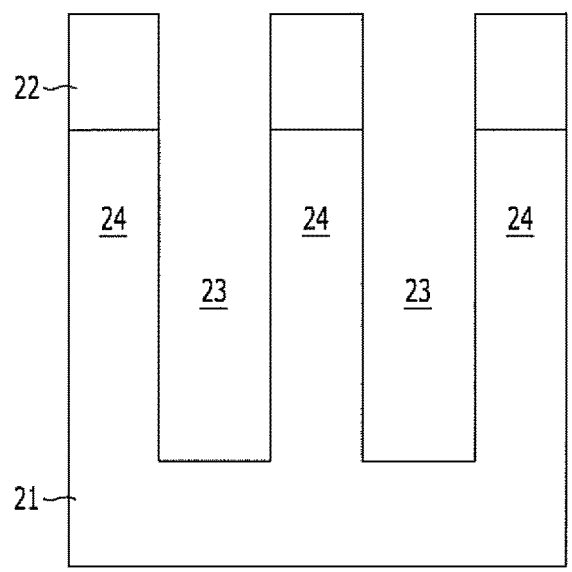
FIGS. 4A to 4N are cross-sectional views explaining a first example of a method for forming the buried bit line in accordance with the embodiments of the present invention.
Figure 4B:
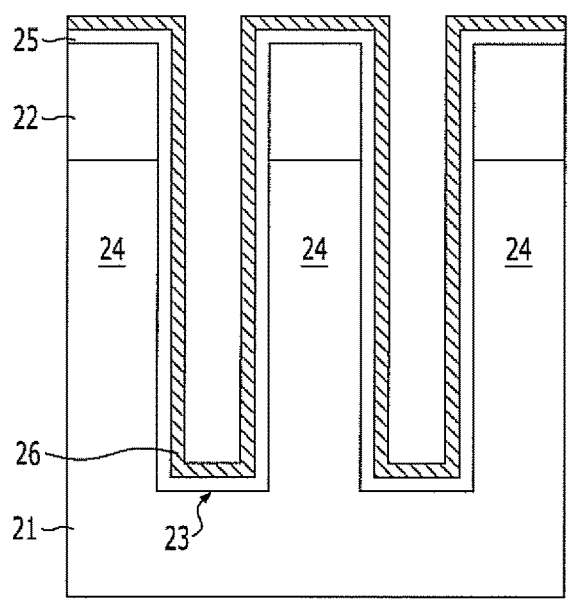
Figure 4C:
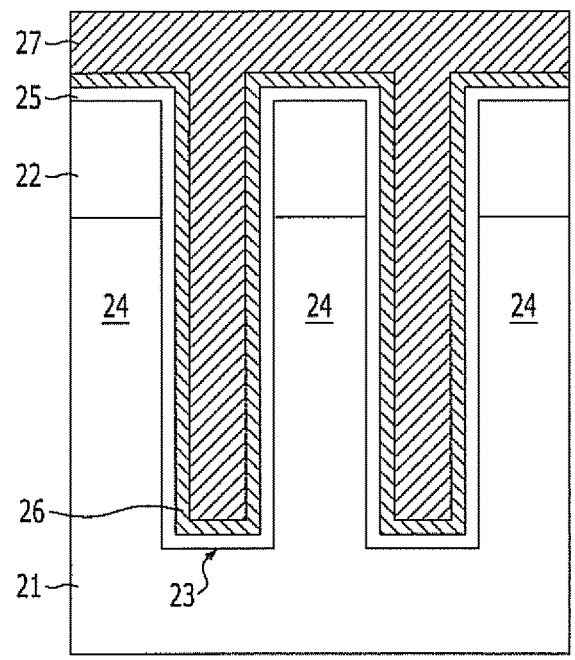
Figure 4D:
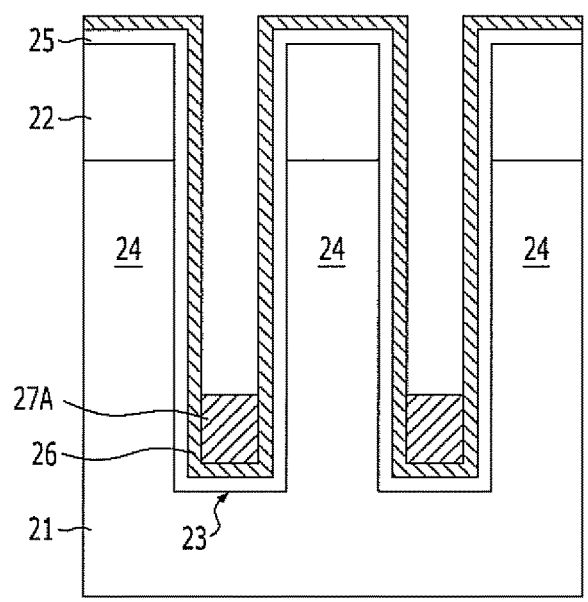
Figure 4E:
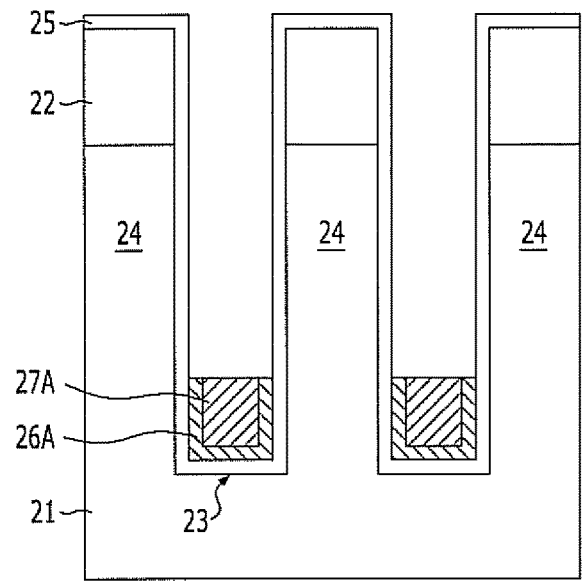
Figure 4F:
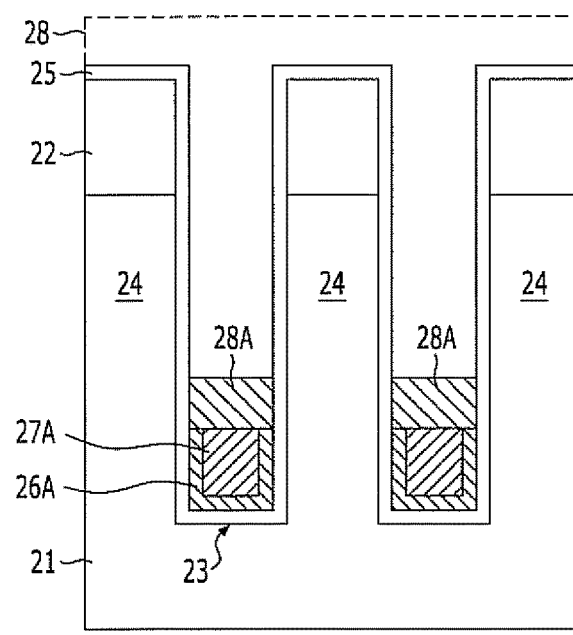
Figure 4G:
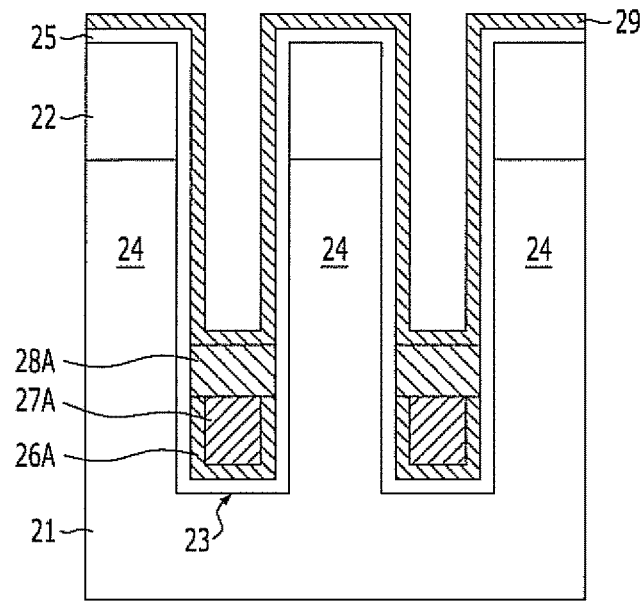
Figure 4H:
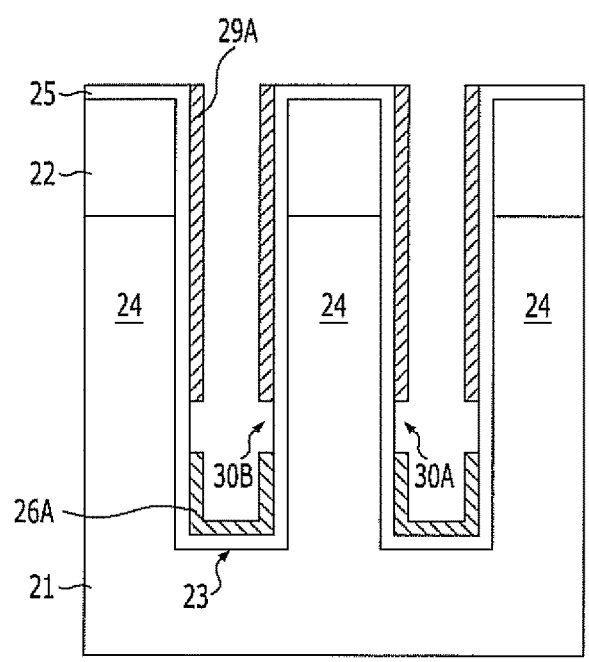
Figure 4I:
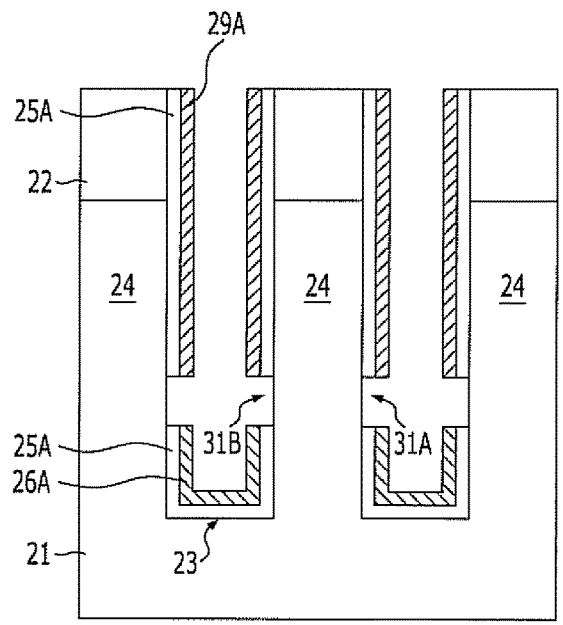
Figure 4J:
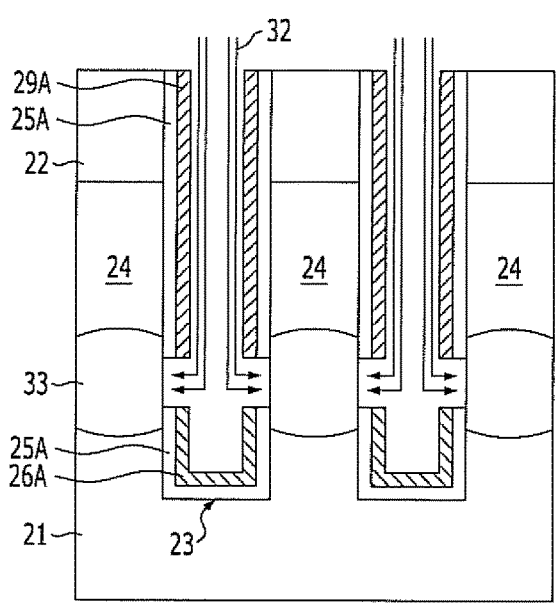
Figure 4K:
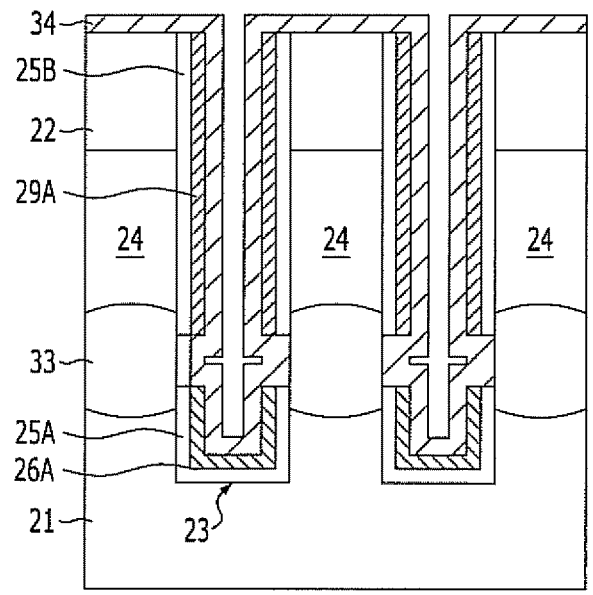
Figure 4L:
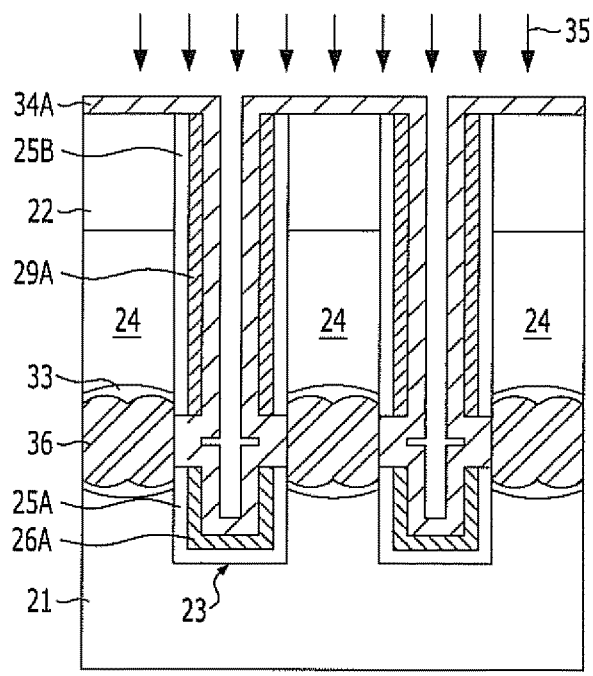
Figure 4M:
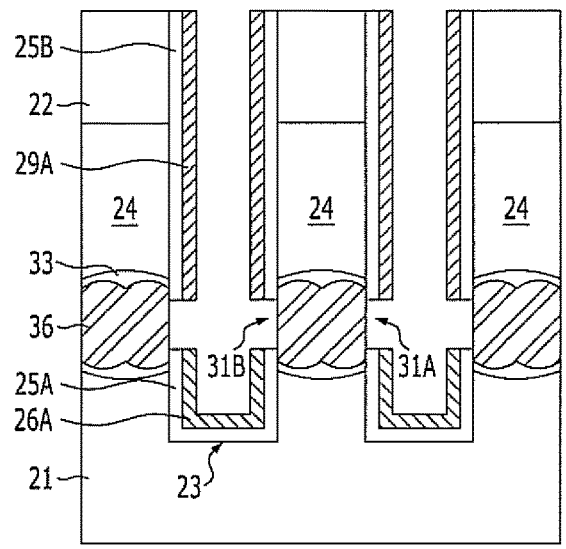
Figure 4N:
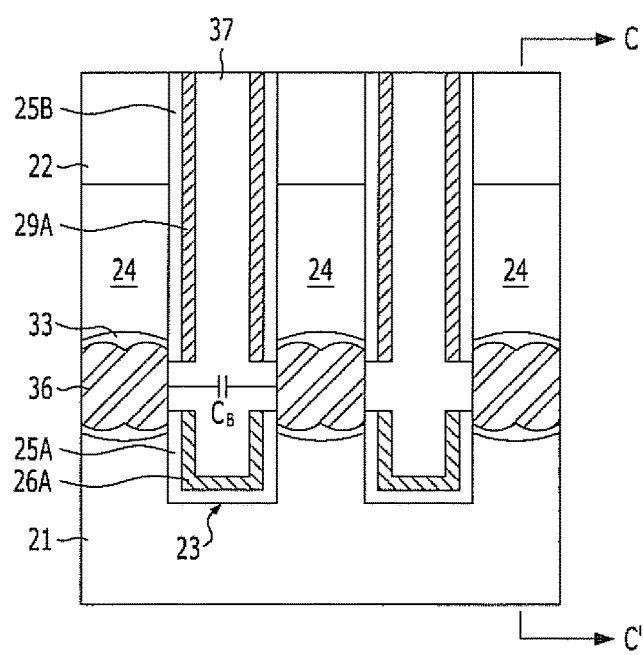

FIGS. 4A to 4N are cross-sectional views illustrating a first example of a method for forming the buried bit line in accordance with the embodiments of the present invention.

Referring to FIG. 4A, a hard mask layer 22 is formed on a semiconductor substrate 21. The semiconductor substrate 21 includes a silicon-containing substance. For example, the semiconductor substrate 21 includes a silicon substrate or a silicon germanium substrate. The hard mask layer 22 includes a nitride layer. The hard mask layer 22 may have a multi-layered structure including an oxide layer and a nitride layer. In such a structure, the hard mask layer 22 may be stacked in the sequence of a hard mask nitride layer and a hard mask oxide layer. According to another example, the hard mask layer 22 may be stacked in the sequence of a hard mask nitride layer, a hard mask oxide layer, a hard mask silicon oxynitride layer and a hard mask carbon layer. In the case where the hard mask layer 22 includes a hard mask nitride layer, a pad oxide layer (not shown) may be additionally formed between the semiconductor substrate 21 and the hard mask layer 22. The pad oxide layer may alleviate any stress induced while forming the hard mask layer 22. The pad oxide layer may include a silicon oxide. The hard mask layer 22 is formed using a photoresist pattern (not shown). The hard mask layer 22 is formed to extend in a first direction. The hard mask layer 22 may be used to form a plurality of pillar structures. The plurality of pillar structures are used in formation of vertical channel transistors. For example, each vertical channel transistor may include a source region, a drain region and a channel region. The channel region may be positioned between the source region and the drain region and may be disposed in a direction perpendicular to the surface of the semiconductor substrate 21. The vertical channel transistor has improved degree of integration and improved operational characteristics.

A trench etching process is performed using the hard mask layer 22 as an etch mask. For example, by etching the semiconductor substrate 21 by a desired depth using the hard mask layer 22 as an etch barrier, bodies 24 are formed. The bodies 24 are separated from one another by trenches 23. Each body 24 has two sidewalls. The trench etching process includes anisotropic etching. In the case where the semiconductor substrate 21 is a silicon substrate, anisotropic etching uses a chlorine-based gas such as $Cl_2$ and $CCl_4$, a bromide-based gas such as HBr, or a mixed gas having $O_2$ gas. The plurality of bodies 24 are separated from one another by the trenches 23. The plurality of bodies 24 are formed to extend in the vertical direction from the surface of the semiconductor substrate 21. As described above, each body 24 has two opposing sidewalls. When viewed from the top, the bodies 24 have linear forms which are separated from one another by the trenches 23.

By forming the bodies 24 in this way, a plurality of structures including the bodies 24 and the hard mask layer 22 are formed. The plurality of structures are separated from one another by the trenches 23. As will be described later, the upper portions of the bodies 24 are subsequently etched and become pillars.

Referring to FIG. 4B, protective layers with different etching selectivities are formed on the entire surface of the structure formed with the bodies 24. The protective layers may be formed by stacking a first protective layer 25 and a second protective layer 26. The first protective layer 25 and the second protective layer 26 may include an oxide layer, a nitride layer, a silicon layer, Ti, Co, Ru, Al, Cu, W and mixtures thereof. Because the first protective layer 25 and the second protective layer 26 are to have different etching selectivities, different substances are selected to form the first protective layer 25 and the second protective layer 26. For example, if an oxide layer is used as the first protective layer 25, a substance having a different etching selectivity from the oxide layer is selected to form the second protective layer 26. If the first protective layer 25 is an oxide layer, a nitride layer may be used as the second protective layer 26.

Referring to FIG. 4C, a first sacrificial layer 27 is formed on the entire surface of a resultant structure including the second protective layer 26 in such a way as to gap-fill the trenches 23 between the bodies 24. A substance having a different etching selectivity from the first and second protective layers 25 and 26 may be used to form the first sacrificial layer 27. The first sacrificial layer 27 may include any one of an oxide layer, a nitride layer, a silicon layer, Ti, Co, Ru, Al, Cu, Wl, and a mixture thereof. Here, while a substance used as the first and second protective layers 25 and 26 may be repeatedly used as the first sacrificial layer 27, a different substance is used to have a different etching selectivity. Hereinbelow, as the first sacrificial layer 27, a silicon layer may be used.

Referring to FIG. 4D, the first sacrificial layer 27 is planarized. The planarization of the first sacrificial layer 27 includes a CMP (chemical mechanical polishing) process. Successively, an etch-back process is performed. By the etch-back process, first sacrificial layer patterns 27A which are recessed are formed. During the etch-back process, the second protective layer 26 is not etched since it has an etching selectivity different from that of the first sacrificial layer 27.

Referring to FIG. 4E, portions of the second protective layer 26 which are exposed by the recessed first sacrificial layer patterns 27A are selectively removed. After such removal, second protective layer patterns 26A having the same height as the first sacrificial layer patterns 27A are formed. In order to remove the second protective layer 26, wet etching or dry etching may be performed.

Referring to FIG. 4F, a second sacrificial layer 28 is formed on the entire surface of the resultant structure formed with the second protective layer patterns 26A. The second sacrificial layer 28 gap-fills the trenches 23. The second sacrificial layer 28 may be formed of a substance having a different etching selectivity from the first protective layer 25. The second sacrificial layer 28 may include any of an oxide layer, a nitride layer, a silicon layer, Ti, Co, Ru, Al, Cu, W and a mixture thereof. Here, while a substance used as the first protective layer 25 may be repeatedly used as the second sacrificial layer 28, a different substance is used to have a different etching selectivity. Hereinbelow, according to the present embodiment, as the second sacrificial layer 28, a silicon layer may be used.

Subsequently, the second sacrificial layer 28 is planarized. The planarization of the second sacrificial layer 28 includes a CMP (chemical mechanical polishing) process. Successively, an etch-back process is performed. By the etch-back process, second sacrificial layer patterns 28A which are recessed are formed. During the etch-back process, the first protective layer 25 is not etched since it has an etching selectivity different from that of the second sacrificial layer 28.

Referring to FIG. 4G, a third protective layer 29 is formed on the entire surface of the resultant structure including the second sacrificial layer patterns 28A. The third protective layer 29 may include any of an oxide layer, a nitride layer, a silicon layer, Ti, Co, Ru, Al, Cu, W and a mixture thereof. The third protective layer 29 may be formed of a substance with a different etching selectivity from the first protective layer 25. Therefore, different substances are selected as the first protective layer 25 and the third protective layer 29. For example, if an oxide layer is used as the first protective layer 25, a substance with a different etching selectivity from the oxide layer is selected as the third protective layer 29. If the oxide layer is used as the first protective layer 25, a nitride layer may be used as the third protective layer 29.

Referring to FIG. 4H, the third protective layer 29 is selectively etched through spacer etching. After the spacer etching, third protective layer patterns 29A are formed. The third protective layer patterns 29A form spacers covering the sidewalls of the bodies 24 and the hard mask layer 22. The third protective layer patterns 29A have a height that covers the sidewalls of the bodies 24 and the hard mask layer 22 on the second sacrificial layer patterns 28A. The third protective layer patterns 29A cover the first protective layer 25. By the third protective layer patterns 29A, the underlying second sacrificial layer patterns 28A are exposed.

Next, the second sacrificial layer patterns 28A are removed. The second sacrificial layer patterns 28A are removed using dry etching or wet etching.

As the second sacrificial layer patterns 28A are removed in this way, preliminary open parts 30A and 30B are formed between the third protective layer patterns 29A and the second protective layer patterns 26A. The preliminary open parts 30A and 30B expose portions of the first protective layer 25. The preliminary open parts 30A and 30B are open with the forms of lines which extend along the sidewalls of the bodies 24. In particular, the preliminary open parts 30A and 30B are open on both sidewalls of the bodies 24.

Next, the first sacrificial layer patterns 27A are removed.

Referring to FIG. 4I, the portions of the first protective layer 25 which are exposed through the preliminary open parts 30A and 30B are selectively removed. By this fact, open parts 31A and 31B are formed. The sidewalls of the bodies 24, which are formed with the open parts 31A and 31B, are covered by first protective layer patterns 25A, the second protective layer patterns 26A and the third protective layer patterns 29A. Around the open parts 31A and 31B, the lower sidewalls of the bodies 24 are covered by the first protective layer patterns 25A and the second protective layer patterns 26A, and the upper sidewalls of the bodies 24 are covered by the first protective layer patterns 25A and the third protective layer patterns 29A. When forming the open parts 31A and 31B, portions of the first protective layer 25 which are formed on the hard mask layer 22 may be simultaneously removed.

The open parts 31A and 31B may be open with the forms of lines which extend along the sidewalls of the bodies 24. Specifically, the open parts 31A and 31B are simultaneously formed on both sidewalls of the bodies 24. Thus, a series of processes for forming the open parts 31A and 31B are referred to as a double-side-contact (DSC) process. The double-side-contact (DSC) process is different from an OSC process in that both sidewalls, not just one sidewall, of each body 24 are opened in the double-side-contact (DSC) process.

Here, the double-side-contact (DSC) process as described above is simpler than the OSC process. Also, tilt ion implantation and an OSC mask may not be used. In particular, the height of the open parts 31A and 31B may be uniformized.

Referring to FIG. 4J, plasma doping 32 is performed. At this time, portions of the sidewalls of the bodies 24 which are exposed through the open parts 31A and 31B are doped. Accordingly, first source/drain regions 33 are formed. The first source/drain regions 33 become source regions or drain regions of vertical channel transistors.

The plasma doping 32 is a method in which a doping source is excited to a plasma state and dopant ions in the excited plasma are implanted into a target object. At this time, by applying a bias voltage to the target object, the dopant ions in the plasma may be doped all at once on the entire surface of the target object. Here, the bias energy is also referred to as doping energy.

The plasma doping 32 is performed using doping energy, a doping dose and a doping source.

The doping source is a substance which contains a dopant to be doped into the first source/drain regions 33. The doping source includes a dopant gas. The doping source uses a dopant gas containing arsenic (As), phosphorus (P), and so forth. For example, the doping source includes $AsH_3$ or $PH_3$. Arsenic (As) and phosphorus (P) are known as N-type dopants. Also, as the doping source, a dopant gas containing boron (B) may be used. Boron is known as a P-type dopant.

The doping energy is a bias voltage applied to the semiconductor substrate 21. The doping energy is applied to the bodies 24 as well. Using such methods, the plasma doping 32 in a lateral direction is performed. Further, the plasma doping 32 in the lateral direction may be performed by impingement of ions in the excited plasma.

The doping dose indicates an implantation amount of the dopant. The doping dose is set to $1 \times 10^{15} \sim 1 \times 10^{17}$ atoms/cm$^2$. By performing the plasma doping 32 using the doping dose with such a range, the dopant doped into the first source/drain regions 33 has a doping concentration equal to or greater than $1 \times 10^{20}$ atoms/cm$^3$.

For the plasma doping 32, a gas for exciting plasma may be introduced. The gas for exciting plasma includes any reasonably suitable gas such as argon (Ar), helium (He), etc.

As described above, since the plasma doping 32 may be performed without a tilt angle, doping is performed without using a shadow effect by a surrounding structure. With such an arrangement, the first source/drain regions 33 may be formed at desired positions. Furthermore, by controlling the doping energy, the first source/drain regions 33 may be simultaneously formed through both open parts 31A and 31B. Accordingly, the first source/drain regions 33 which are simultaneously formed through both open parts 31A and 31B may be connected with each other and may form one region.

As another method for forming the first source/drain regions 33, doped polysilicon in situ doped with a dopant may be used. For example, by performing annealing after gap-filling the doped polysilicon, the dopant in the doped polysilicon may be diffused into the bodies 24.

Referring to FIG. 4K, a conductive layer 34 is formed on the entire surface of the resultant structure including the open parts 31A and 31B. The conductive layer 34 includes a metal such as a near-noble metal and a refractory metal. The conductive layer 34 includes a metal capable of silicidation. For example, the conductive layer 34 includes any one selected among cobalt (Co), titanium (Ti), tantalum (Ta), nickel (Ni), tungsten (W), platinum (Pt) and palladium (Pd). The conductive layer 34 is formed using chemical vapor deposition (CVD) or atomic layer deposition (ALD). The deposition thickness of the conductive layer 34 is determined to be sufficient to fill at least the open parts 31A and 31B. Such a thickness is selected to permit full silicidation in a subsequent silicidation process.

Referring to FIG. 4L, annealing 35 is performed. By performing the annealing, silicidation is achieved in which the conductive layer 34 and the bodies 24 react with each other. Since the conductive layer 34 is a metal and the material of the bodies 24 contains silicon, a metal silicide 36 is formed by the reaction of the conductive layer 34 and the bodies 24. The metal silicide 36 includes any one selected among a cobalt silicide, a titanium silicide, a tantalum silicide, a nickel silicide, a tungsten silicide, a platinum silicide and a palladium silicide. The annealing 35 includes rapid thermal annealing (RTA). The rapid thermal annealing (RTA) may be performed at different temperatures depending upon the kinds of the bodies 24 and the conductive layer 34. For example, in the case where the conductive layer 34 is formed using cobalt (Co), an annealing temperature range may be 400° C. to 800° C. The metal silicide 36 may be formed to have a fully silicidized (FUSI) structure. By sufficiently performing silicidation from both sidewalls of the bodies 24, the portions of the bodies 24 which are exposed through the open parts 31A and 31B are fully silicidized through the length of the bodies between the open parts. Through full silicidation, the metal silicide 36 is formed in the bodies 24.

After forming the metal silicide 36, an unreacted conductive layer 34A remains. The metal silicide 36, which is formed through the silicidation process as described above, becomes buried bit lines (BBL). Hereinbelow, the metal silicide is referred to as buried bit lines 36.

Referring to FIG. 4M, the unreacted conductive layer 34A is removed. The unreacted conductive layer 36A may be removed through wet etching.

Meanwhile, in the case where the conductive layer 34 is formed using cobalt, in order to form a cobalt silicide, rapid thermal annealing (RTA) may be performed at least twice. For example, primary annealing and secondary annealing are performed. The primary annealing is performed at a temperature of 400° C. to 600° C., and the secondary annealing is performed at a temperature of 600° C. to 800° C. By the primary annealing, a cobalt silicide with the phase of $CoSi_x$ (x=0.1~1.5) is formed. By the secondary annealing, a cobalt silicide with the phase of $CoSi_2$ is obtained. Among cobalt silicides, the cobalt silicide with the phase of $CoSi_2$ has smallest specific resistance. Unreacted cobalt is removed between the primary annealing and the secondary annealing. The unreacted cobalt may be removed using a mixed chemical of sulphuric acid ($H_2SO_4$) and hydrogen peroxide ($H_2O_2$).

Referring to FIG. 4N, an interlayer dielectric layer 37 is formed on the entire surface of the resultant structure in such a way as to gap-fill the trenches 23. The interlayer dielectric layer 37 may include an oxide such as BPSG. The interlayer dielectric layer 37 may be planarized such that the surface of the hard mask layer 22 is exposed.

FIGS. 5A to 5D are cross-sectional views illustrating a second example of the method for forming the buried bit line in accordance with the embodiments of the present invention. This second example is a variation of the first example, and an air gap 40 is defined between adjacent buried bit lines 36.

Figure 5A:
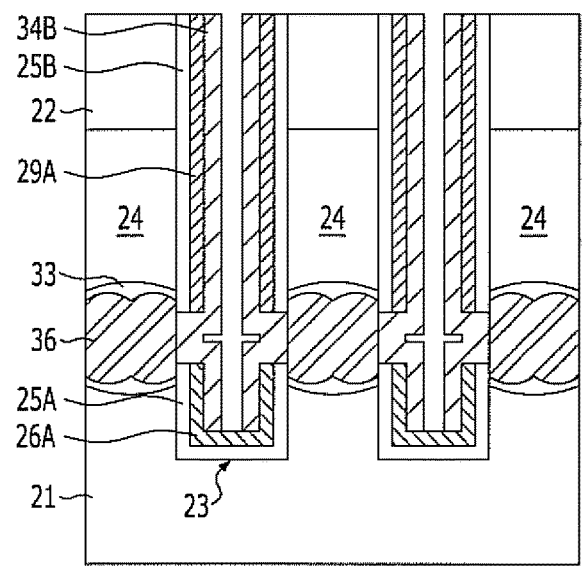
FIGS. 5A to 5D are cross-sectional views illustrating a second example of the method for forming the buried bit line in accordance with the embodiments of the present invention.

Referring to FIG. 5A, the unreacted conductive layer 34A is etched back after performing of the annealing shown in FIG. 4L. By this fact, an unreacted conductive layer 34B with the forms of spacers remains on the sidewalls of the bodies 24.

Figure 5B:
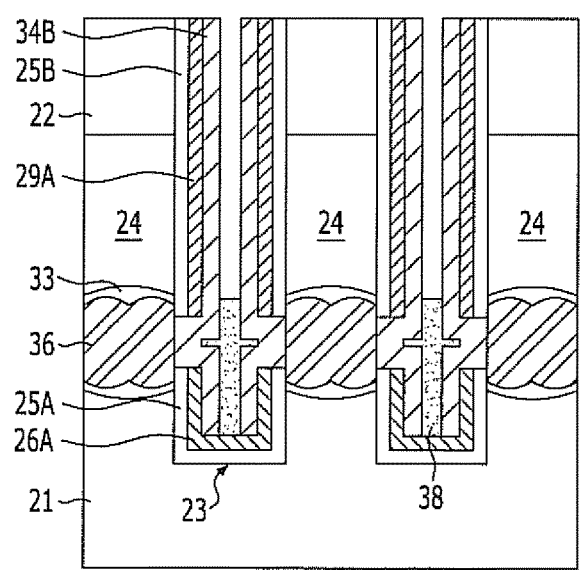

Referring to FIG. 5B, a first dielectric layer 38 is formed on the unreacted conductive layer 34B in such a way as to gap-fill the trenches 23. Subsequently, the first dielectric layer 38 is recessed by a desired depth. According to this fact, the first dielectric layer 38 which partially gap-fills the trenches 23 remains. The first dielectric layer 38 may include any reasonably suitable dielectric layer such as a silicon oxide, a silicon nitride, etc. The recessing depth of the first dielectric layer 38 is set to equal to at least the height of the buried bit lines 36.

Figure 5C:
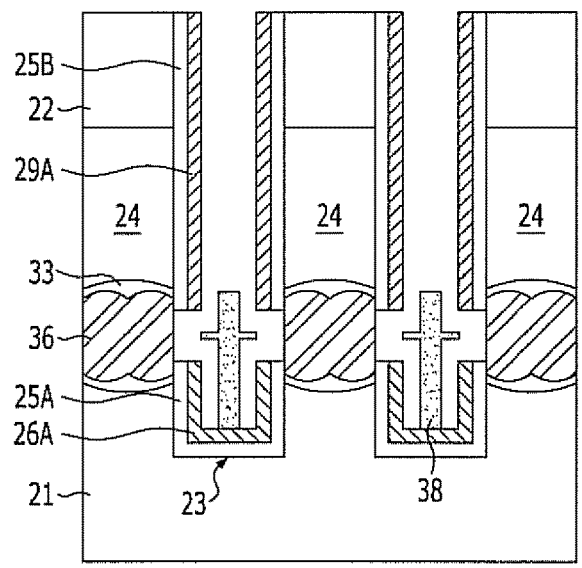

Referring to FIG. 5C, the unreacted conductive layer 34B is removed. After such removal, for example, only the first dielectric layer 38 remains in the trenches 23, and both sidewalls of the buried bit lines 36 are exposed.

Figure 5D:
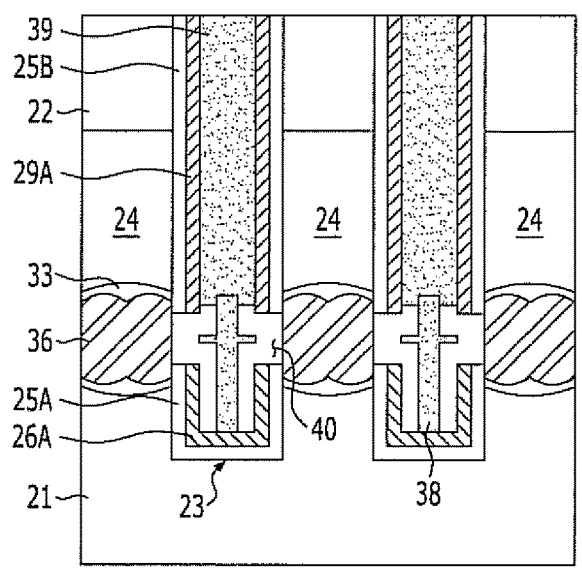

Referring to FIG. 5D, a second dielectric layer 39 is gap-filled over the first dielectric layer 38. The second dielectric layer 39 may include an oxide such as BPSG and the like. The second dielectric layer 39 may be planarized such that the surface of the hard mask layer 22 is exposed. By the formation of the second dielectric layer 39, air gaps 40 are defined between the first dielectric layer 38 and the buried bit lines 36. In other words, the second dielectric layer 39 is not gap-filled all the way to the bottoms of the trenches 23 due to the presence of the first dielectric layer 38. Plasma enhanced chemical vapor deposition (PECVD) may be adopted such that the air gaps 40 are formed as described above.

According to this second example, as the air gaps 40 are defined between adjacent buried bit lines 36, the parasitic capacitance between the buried bit lines 36 may be further reduced.

FIGS. 6A to 6L are cross-sectional views illustrating a third example of the method for forming the buried bit line in accordance with the embodiments of the present invention.

Figure 6A:
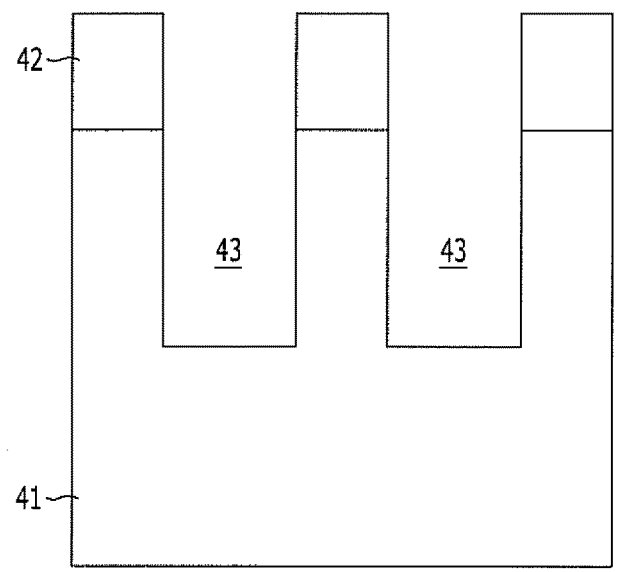
FIGS. 6A to 6L are cross-sectional views illustrating a third example of the method for forming the buried bit line in accordance with the embodiments of the present invention.

Referring to FIG. 6A, a hard mask layer 42 is formed on a semiconductor substrate 41. The semiconductor substrate 41 includes a silicon-containing substance. For example, the semiconductor substrate 41 includes a silicon substrate or a silicon germanium substrate. The hard mask layer 42 includes a nitride layer. The hard mask layer 42 may have a multi-layered structure including an oxide layer and a nitride layer. In such a structure, the hard mask layer 42 may be stacked in the sequence of a hard mask nitride layer and a hard mask oxide layer. According to another example, the hard mask layer 42 may be stacked in the sequence of a hard mask nitride layer, a hard mask oxide layer, a hard mask silicon oxynitride layer and a hard mask carbon layer. In the case where the hard mask layer 42 includes a hard mask nitride layer, a pad oxide layer (not shown) may be additionally formed between the semiconductor substrate 41 and the hard mask layer 42. The pad oxide layer may alleviate any stress induced while forming the hard mask layer 42. The pad oxide layer may include a silicon oxide. The hard mask layer 42 is formed using a photoresist pattern (not shown). The hard mask layer 42 is formed to extend in a first direction.

A trench etching process is performed using the hard mask layer 42 as an etch mask. For example, by etching the semiconductor substrate 41 by a desired depth using the hard mask layer 42 as an etch barrier, first trenches 43 are defined. The trench etching process includes anisotropic etching. In the case where the semiconductor substrate 21 is a silicon substrate, the anisotropic etching uses a chlorine-based gas such as $Cl_2$ and $CCl_4$, a bromide-based gas such as HBr, or a mixed gas having $O_2$ gas.

Figure 6B:
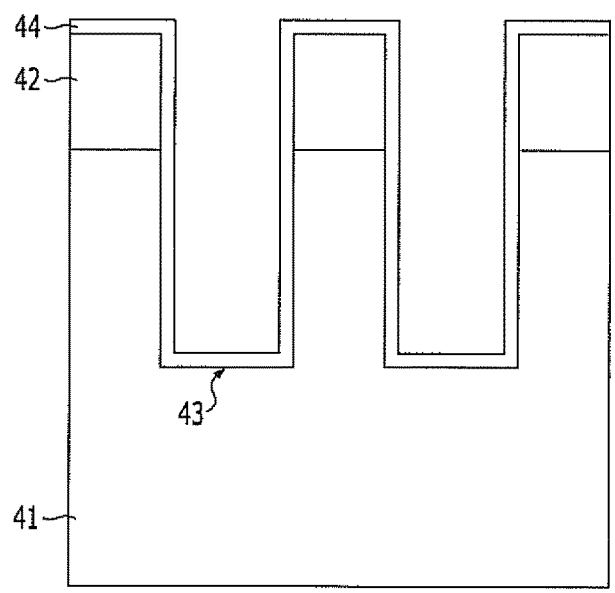

Referring to FIG. 6B, a first protective layer 44 is formed on the entire surface of the resultant structure including the first trenches 43. The first protective layer 44 may include any of an oxide layer, a nitride layer, a silicon layer, Ti, Co, Ru, Al, Cu, W and a mixture thereof.

Figure 6C:
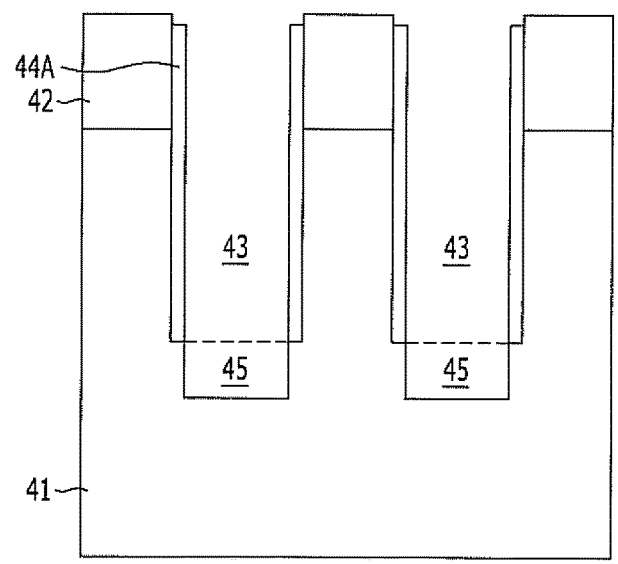

Referring to FIG. 6C, spacer etching is performed. After the spacer etching, the first protective layer 44 is etched, and first protective layer patterns 44A are formed. The first protective layer patterns 44A form spacers.

The bottoms of the first trenches 43 are etched by a desired depth using the first protective layer patterns 44A as an etch mask. Accordingly, second trenches 45 are defined. The second trenches 45 may have a depth greater than the first trenches 43. A process for defining the second trenches 45 is a trench etching process including anisotropic etching. In the case where the semiconductor substrate 41 is a silicon substrate, the anisotropic etching uses a chlorine-based gas such as $Cl_2$ and $CCl_4$, a bromide-based gas such as HBr, or a mixed gas having $O_2$ gas.

Figure 6D:
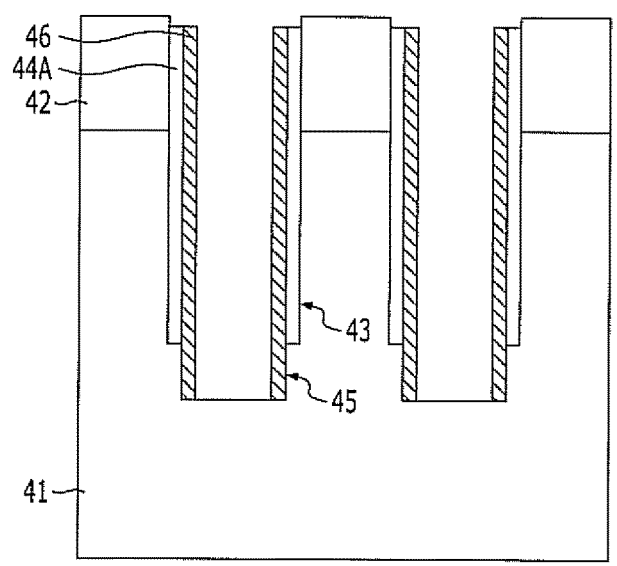

Referring to FIG. 6D, second protective layer patterns 46 are formed. The second protective layer patterns 46 are formed by performing spacer etching after depositing a second protective layer. The second protective layer patterns 46 have the forms of spacers. The second protective layer patterns 46 cover the first protective layer patterns 44A and cover both sidewalls of the second trenches 45. The second protective layer patterns 46 may have a different etching selectivity from the first protective layer patterns 44A. The second protective layer patterns 46 may include any of an oxide layer, a nitride layer, a silicon layer, Ti, Co, Ru, Al, Cu, W and a mixture thereof. Here, while a substance used as the first protective layer patterns 44A may be repeatedly used as the second protective layer patterns 46, a different substance is used to have a different etching selectivity. For instance, the first protective layer patterns 44A are an oxide layer, and the second protective layer patterns 46 are a nitride layer.

Figure 6E:
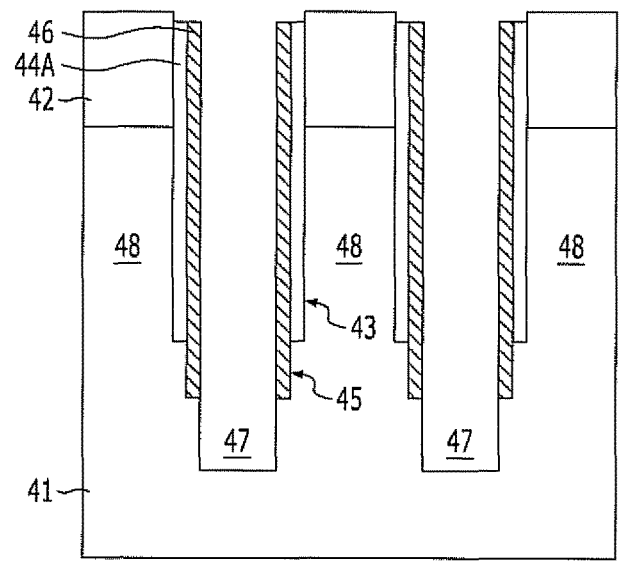

Referring to FIG. 6E, the bottoms of the second trenches 45 are etched using the second protective layer patterns 46 as an etch mask. After the etching, third trenches 47 are defined. The third trenches 47 may have a depth greater than the first trenches 43. A process for defining the third trenches 47 is a trench etching process including anisotropic etching. In the case where the semiconductor substrate 41 is a silicon substrate, the anisotropic etching uses a chlorine-based gas such as $Cl_2$ and $CCl_4$, a bromide-based gas such as HBr, or a mixed gas having $O_2$ gas.

As the third trenches 47 are defined in this way, multiple trenches each constituted by the first trench 43, the second trench 45 and the third trench 47 are defined. Each of the multiple trenches has a line width that gradually decreases in each lower trench. Hence, step profiles may be formed at the boundaries of the trenches.

By outlines of the multiple trenches 43, 45 and 47, a plurality of bodies 48 are formed in the semiconductor substrate 41. The bodies 48 have both opposing sidewalls. For example, each body 48 may be divided into a first body by the first trench 43, a second body by the second trench 45 and a third body by the third trench 47.

Figure 6F:
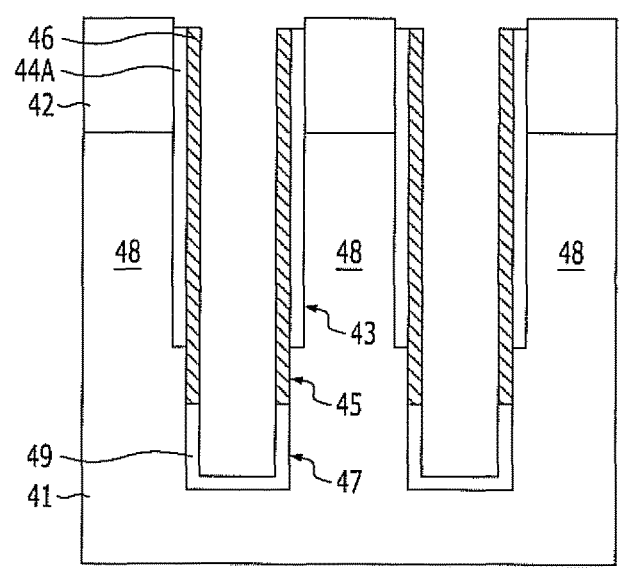

Referring to FIG. 6F, a third protective layer 49 (for example, by oxidizing third trenches 47 through thermal oxidation) is formed on the surfaces of the third trenches 47. The third protective layer 49 may be formed of a substance which has a different etching selectivity from the second protective layer patterns 46. The third protective layer 49 may include any of an oxide layer, a nitride layer, a silicon layer, Ti, Co, Ru, Al, Cu, W and a mixture thereof. Here, while a substance used as the second protective layer patterns 46 may be repeatedly used as the third protective layer 49, a different substance may also be used to have a different etching selectivity. For example, if a nitride layer is used as the second protective layer patterns 46, an oxide layer may be used as the third protective layer 49. The third protective layer 49 may be formed through thermal oxidation. The third protective layer 49 may be formed by oxidating the surfaces of the third trenches 47 through thermal oxidation. At this time, the third protective layer 49 becomes an oxide layer, particularly, a silicon oxide layer.

Figure 6G:
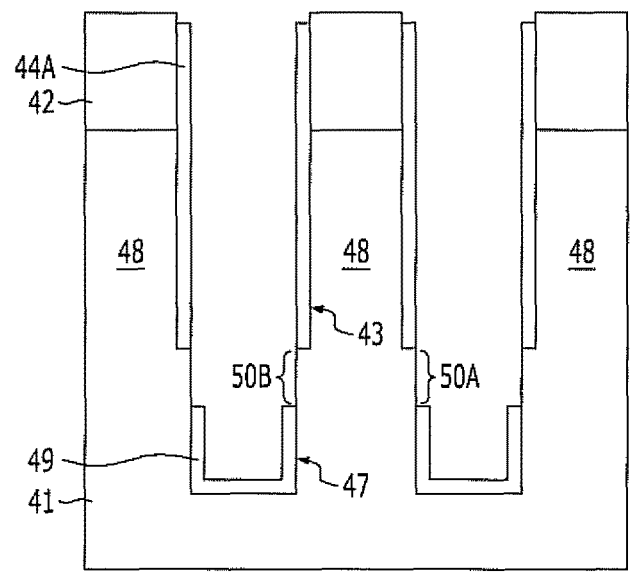

Referring to FIG. 6G, the second protective layer patterns 46 are removed. The second protective layer patterns 46 are removed using dry etching or wet etching. For example, when the bodies 48 are divided into first bodies, second bodies and third bodies, by removing the second protective layer patterns 46, the sidewalls of the second bodies for the second trenches 45 are exposed.

In this way, by removing the second protective layer patterns 46, open parts 50A and 50B are formed between the first protective layer patterns 44A and the third protective layer 49. The open parts 50A and 50B expose portions of both sidewalls of the bodies 48. The sidewalls of the bodies 48 formed with the open parts 50A and 50B are covered by the first protective layer patterns 44A and the third protective layer 49. Around the open parts 50A and 50B, the lower sidewalls of the bodies 48 are covered by the third protective layer 49, and the upper sidewalls of the bodies 48 are covered by the first protective layer patterns 44A.

The open parts 50A and 50B may be open with the forms of lines which extend along the sidewalls of the bodies 48. Specifically, the open parts 50A and 50B are simultaneously formed on both sidewalls of the bodies 48. Thus, a series of processes for forming the open parts 50A and 50B are referred to as a double-side-contact (DSC) process. The double-side-contact (DSC) process is different from an OSC process in that both sidewalls, not just one sidewall, of each body 48 are opened.

Here, the double-side-contact (DSC) process as described above is simpler than the OSC process. Also, tilt ion implantation and an OSC mask may not be used. In particular, the height of the open parts 50A and 50B may be uniformized.

Figure 6H:
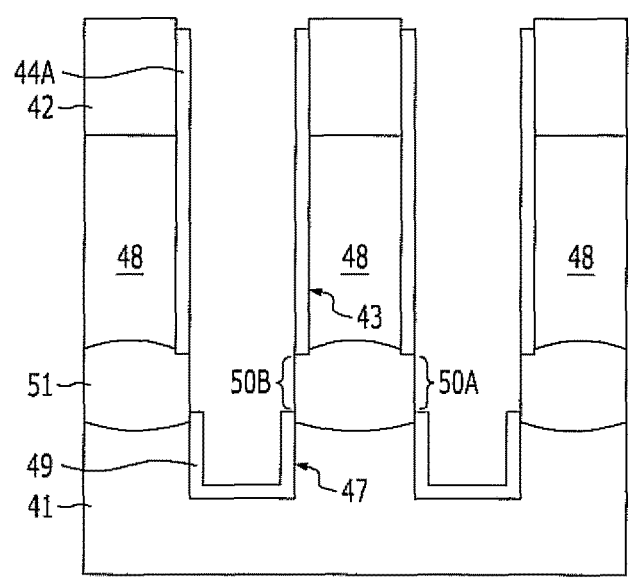

Referring to FIG. 6H, first source/drain regions 51 are formed. In order to form the first source/drain regions 51, plasma doping like the one performed in the first example may be performed. By the plasma doping, portions of the sidewalls of the bodies 48 which are exposed through the open parts 50A and 50B are doped. Accordingly, the first source/drain regions 51 are formed. The first source/drain regions 51 become source regions or drain regions of vertical channel transistors. For plasma doping, details thereof are the same as in the first example.

As an example of another method for forming the first source/drain regions 51, doped polysilicon in situ doped with a dopant may be used. For example, by performing annealing after gap-filling the doped polysilicon, the dopant in the doped polysilicon may be diffused into the bodies 48.

Figure 6I:
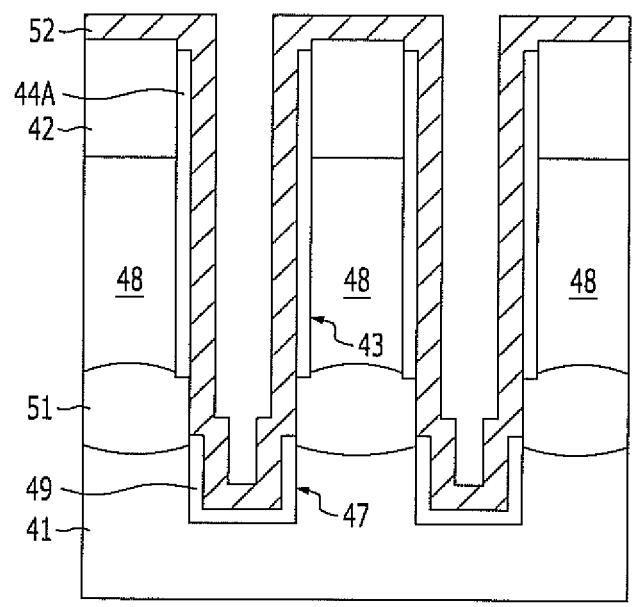

Referring to FIG. 6I, a conductive layer 62 is formed on the entire surface of the resultant structure including the open parts 50A and 50B. The conductive layer 52 includes a metal such as a near-noble metal and a refractory metal. The conductive layer 34 includes a metal capable of silicidation. For example, the conductive layer 52 includes any one selected among cobalt (Co), titanium (Ti), tantalum (Ta), nickel (Ni), tungsten (W), platinum (Pt) and palladium (Pd). The conductive layer 52 is formed using chemical vapor deposition (CVD) or atomic layer deposition (ALD). The deposition thickness of the conductive layer 52 is determined to be sufficient to fill at least the open parts 50A and 50B. Such a thickness is selected to permit full silicidation in a subsequent silicidation process.

Figure 6J:
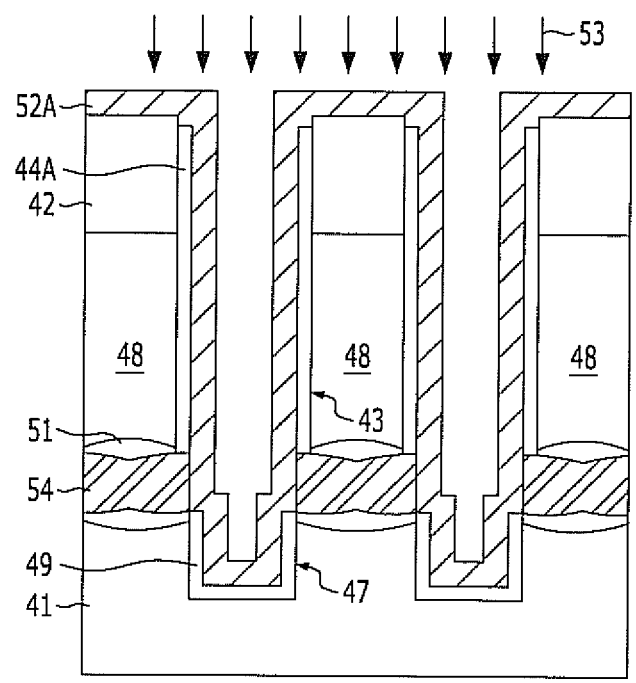

Referring to FIG. 6J, annealing 53 is performed. According to this fact, silicidation is achieved in which the conductive layer 52 and the bodies 48 react with each other. Since the conductive layer 52 is a metal and the material of the bodies 48 contains silicon, a metal silicide 54 is formed by the reaction of the conductive layer 52 and the bodies 48. The metal silicide 54 includes any one selected among a cobalt silicide, a titanium silicide, a tantalum silicide, a nickel silicide, a tungsten silicide, a platinum silicide and a palladium silicide. The annealing 53 includes rapid thermal annealing (RTA). The rapid thermal annealing (RTA) may be performed at different temperatures depending upon the kinds of the bodies 48 and the conductive layer 52. For example, in the case where the conductive layer 52 is formed using cobalt (Co), an annealing temperature range may be 400° C. to 800° C. The metal silicide 54 may be formed to have a fully silicidized (FUSI) structure. By sufficiently performing silicidation from both sidewalls of the bodies 48, the portions of the bodies 48 which are exposed through the open parts 50A and 50B are fully silicidized. Through full silicidation, the metal silicide 54 is formed in the bodies 48.

After forming the metal silicide 54, an unreacted conductive layer 52A remains.

Figure 6K:
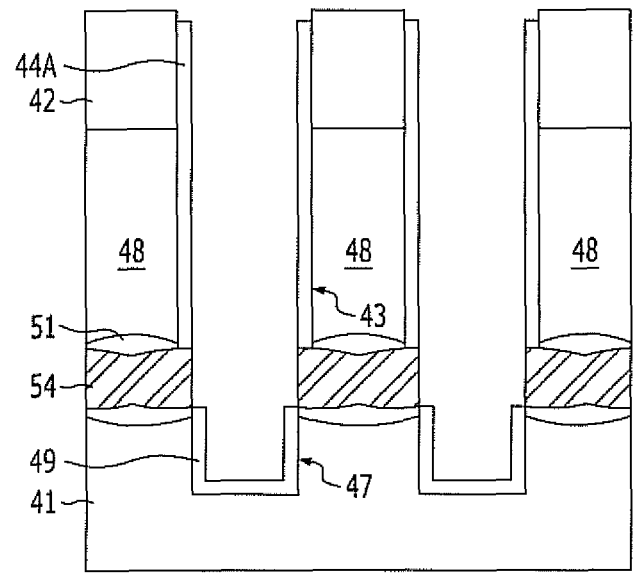

Referring to FIG. 6K, the unreacted conductive layer 52A is removed. The unreacted conductive layer 52A may be removed through wet etching.

Meanwhile, in the case where the conductive layer 52 is formed using cobalt, in order to form a cobalt silicide, rapid thermal annealing (RTA) may be performed at least twice. For example, primary annealing and secondary annealing are performed. The primary annealing is performed at a temperature of 400° C. to 600° C., and the secondary annealing is performed at a temperature of 600° C. to 800° C. By the primary annealing, a cobalt silicide with the phase of $CoSi_x$ (x=0.1~1.5) is formed. By the secondary annealing, a cobalt silicide with the phase of $CoSi_2$ is obtained. Among cobalt silicides, the cobalt silicide with the phase of $CoSi_2$ has smallest specific resistance. Unreacted cobalt is removed between the primary annealing and the secondary annealing. The unreacted cobalt may be removed using a mixed chemical of sulphuric acid ($H_2SO_4$) and hydrogen peroxide ($H_2O_2$).

The metal silicide 54, which is formed through the silicidation process as described above, becomes buried bit lines (BBL). Hereinbelow, the metal silicide is referred to as buried bit lines 54.

Figure 6L:
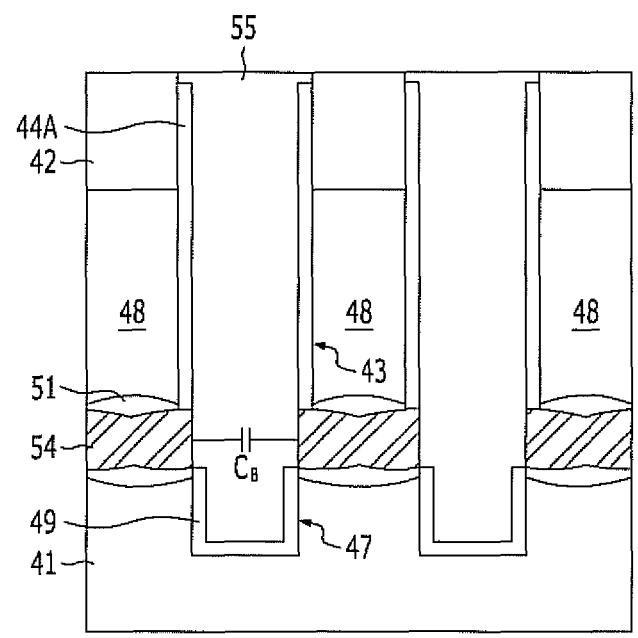

Referring to FIG. 6L, an interlayer dielectric layer 55 is formed on the entire surface of the resultant structure in such a way as to gap-fill the multiple trenches. The interlayer dielectric layer 55 may include an oxide such as BPSG. The interlayer dielectric layer 55 may be planarized such that the surface of the hard mask layer 42 is exposed.

Figure 7A:
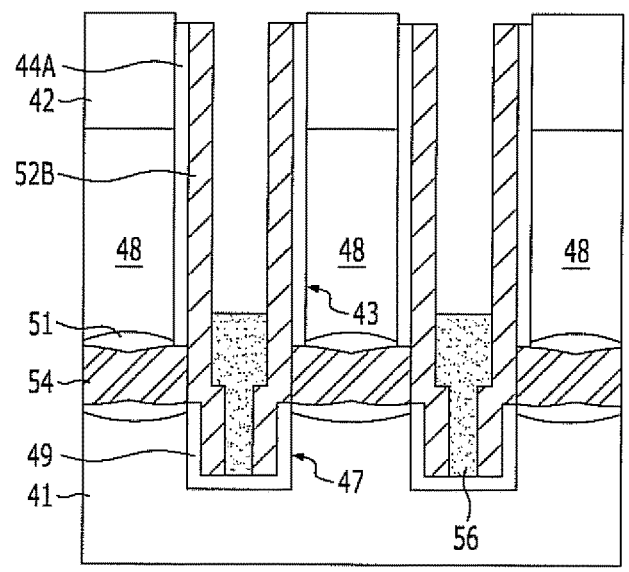
FIGS. 7A to 7C are cross-sectional views illustrating a fourth example of the method for forming the buried bit line in accordance with the embodiments of the present invention.
Figure 7B:
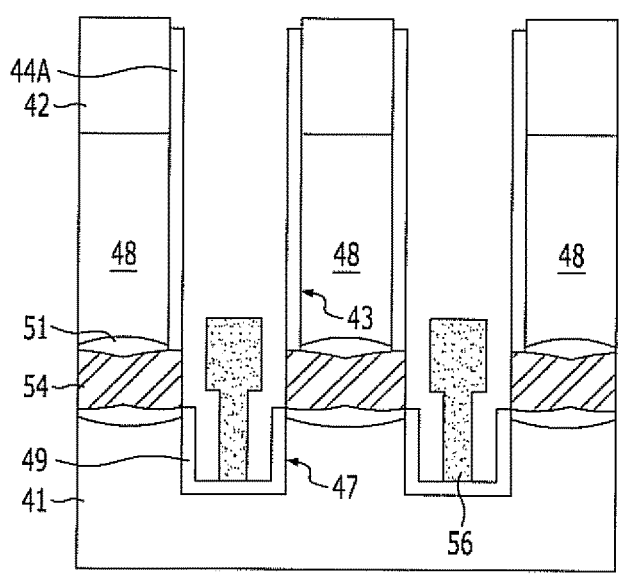
Figure 7C:
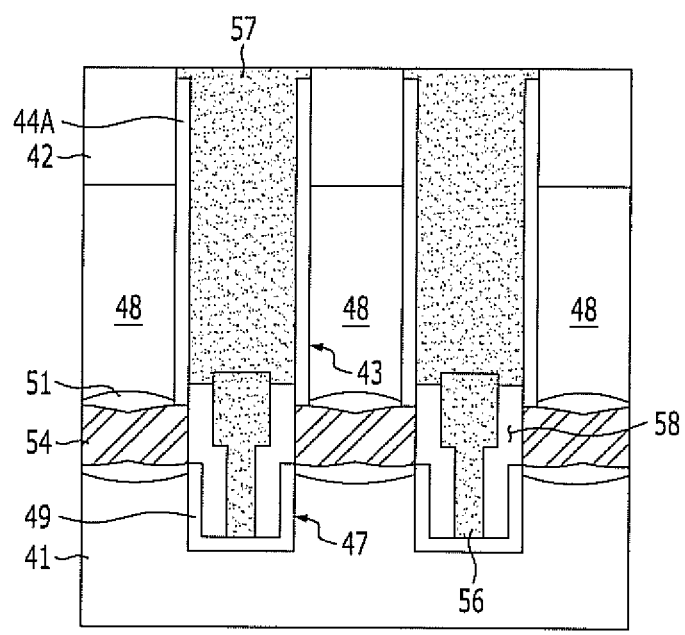

FIGS. 7A to 7C are cross-sectional views illustrating a fourth example of the method for forming the buried bit line in accordance with the embodiments of the present invention. This fourth example is a variation of the third example, and an air gap 58 is defined between adjacent buried bit lines 54.

Referring to FIG. 7A, the unreacted conductive layer 52A is etched back after performing of the annealing shown in FIG. 63. After the etching, an unreacted conductive layer 52B with the forms of spacers remains on the sidewalls of the bodies 48.

A first dielectric layer 56 is formed on the unreacted conductive layer 52B in such a way as to gap-fill the multiple trenches. Subsequently, the first dielectric layer 56 is recessed by a desired depth. After the recession, the first dielectric layer 56 which partially gap-fills the multiple trenches remains. The first dielectric layer 56 may include any reasonably suitable dielectric layer such as a silicon oxide, a silicon nitride, etc. The recessing depth of the first dielectric layer 56 is set to equal at least the height of the buried bit lines 54.

Referring to FIG. 7B, the unreacted conductive layer 52B is removed. After the removal, for example, only the first dielectric layer 56 remains in the multiple trenches, and both sidewalls of the buried bit lines 54 are exposed.

Referring to FIG. 7C, a second dielectric layer 57 is gap-filled over the first dielectric layer 56. The second dielectric layer 57 may include an oxide such as BPSG and the like. The second dielectric layer 57 may be planarized such that the surface of the hard mask layer 42 is exposed. By the formation of the second dielectric layer 57, air gaps 58 are defined between the first dielectric layer 56 and the buried bit lines 54. In other words, the second dielectric layer 57 is not gap-filled all the way to the bottoms of the multiple trenches due to the presence of the first dielectric layer 56. Plasma enhanced chemical vapor deposition (PECVD) may be adopted such that the air gaps 58 are defined as described above.

According to this fourth example, as the air gaps 58 are defined between adjacent buried bit lines 54, the parasitic capacitance between the buried bit lines 54 may be further reduced.

According to the above-described method for forming buried bit lines, both sidewalls of the bodies 24 or 48 are simultaneously opened through the double-side-contact process, and subsequently, by performing a silicidation process for achieving full silicidation, the metal silicide serving as the buried bit lines 36 or 54 is formed. Since the metal silicide is fully silicidized from both sidewalls of the bodies 24 or 48, the buried bit lines 36 or 54 are formed in the bodies 24 or 48. The structures in which the buried bit lines 36 or 54 are directly formed in the bodies 24 or 48 are referred to as direct metal buried bit lines (DMBBL). In other words, the buried bit lines 36 or 54 are formed not in trenches (including multiple trenches) but in the bodies 24 or 48. Accordingly, adjacent buried bit lines 36 or 54 are sufficiently separated from each other due to the presence of the trenches, and parasitic capacitance (see $C_B$ in FIG. 4N or 6L) between adjacent buried bit lines 36 or 54 is reduced.

Furthermore, because second source/drain regions and channel regions of vertical channel transistors are formed by etching the upper portions of the bodies 24 or 48, contact plugs for connecting the buried bit lines 36 or 54 with the vertical channel transistors are not necessary.

Moreover, since the buried bit lines 36 or 54 are formed using a metal silicide, the resistance of the buried bit lines 36 or 54 may be reduced. Because the resistance of the buried bit lines 36 or 54 is reduced, the operation speed of a device is improved.

In addition, as shown in relation with the second example or the fourth example, due to the fact that the air gaps 40 or 58 are defined between adjacent buried bit lines 36 or 54, the parasitic capacitance between adjacent buried bit lines 36 or 54 may be further reduced.

FIGS. 8A to 8E are cross-sectional views illustrating an example of a method for forming a semiconductor device including the buried bit line in accordance with the embodiments of the present invention. FIGS. 8A to 8E are views taken along the line C-C' of FIG. 4N.

Figure 8A:
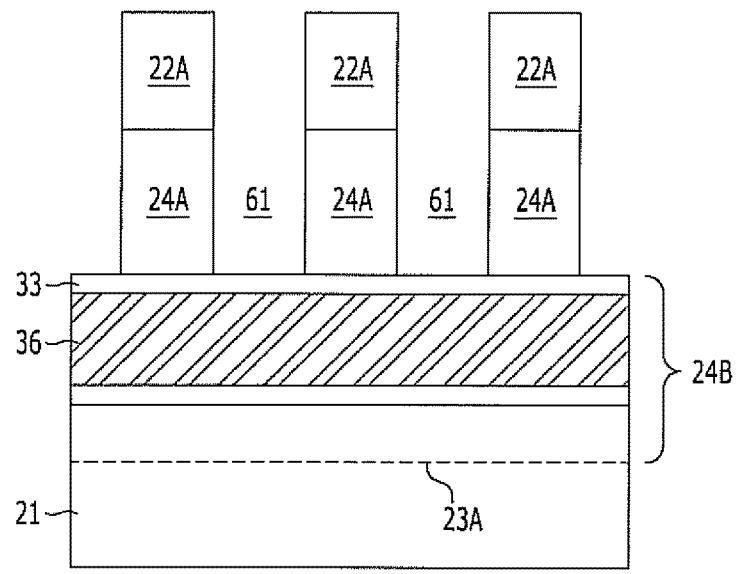
FIGS. 8A to 8E are cross-sectional views illustrating an example of a method for forming a semiconductor device including the buried bit line in accordance with the embodiments of the present invention.

Referring to FIG. 8A, word line trenches 61 are defined. A photoresist pattern (not shown) is used for defining the word line trenches 61. The hard mask layer 22 is etched using the photoresist pattern as an etch mask. Successively, the upper portions of the bodies 24 are etched by a desired depth. While not shown in the cross-sectional view taken along the line C-C' of FIG. 4N, the interlayer dielectric layer 37 (see FIG. 4N) may be etched by the desired depth as well.

By etching the upper portions of the bodies 24 in this way, pillars 24A are formed on the bodies 24B. The bodies 24B and the pillars 24A serve as active regions. The bodies 24B are separated by the trenches 23 and form lines that extend in the same direction as the buried bit lines 36. The pillars 24A vertically extend from the bodies 24. The pillars 24A are formed by the unit of cell. Accordingly, a plurality of pillars 24A are formed on one body 24B and are separated from one another by the word line trenches 61. The depth of the word line trenches 61 may have a dimension so as not to expose the buried bit lines 36. The reference numeral 23A designates the bottoms of the trenches 23 (see FIG. 4N).

The pillars 24A have structures in which the source/drain regions and the channel regions of vertical channel transistors are formed. The plurality of pillars 24A may have the layout of a matrix type array on the bodies 24B.

Figure 8B:
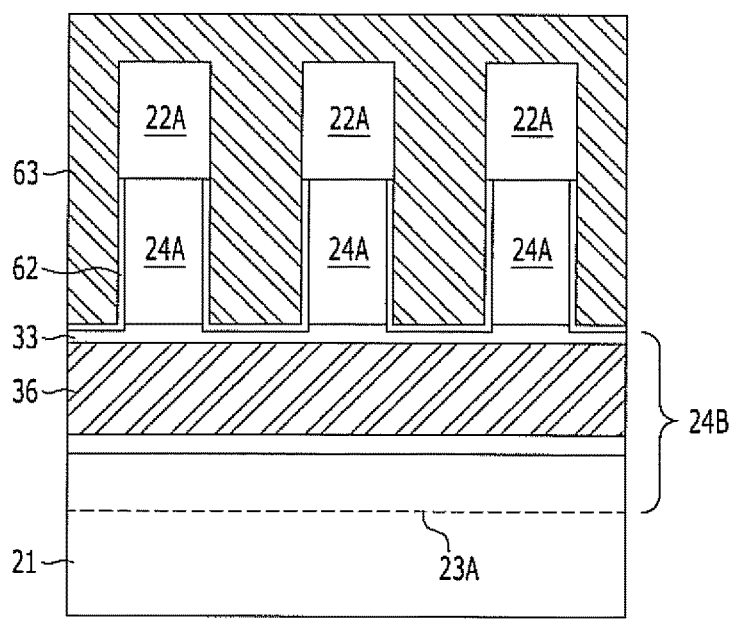

Referring to FIG. 8B, a word line conductive layer 63 is formed to gap-fill the word line trenches 61. A gate dielectric layer 62 may be formed before forming the word line conductive layer 63. The gate dielectric layer 62 may be formed by oxidating the sidewalls of the pillars 24A and the upper surfaces of the bodies 24B. The word line conductive layer 63 uses a low resistance substance. For example, a metallic layer may be used. The metallic layer may include any reasonably suitable material including a titanium layer, a titanium nitride layer, a tungsten layer, and so forth.

Figure 8C:
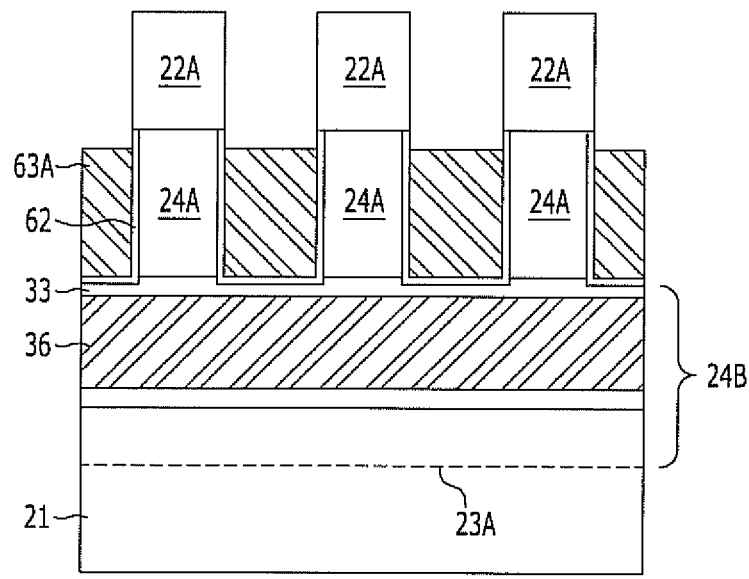

Referring to FIG. 8C, by sequentially performing planarization and etch-back for the word line conductive layer 63, a recessed word line conductive layer 63A remains.

Figure 8D:
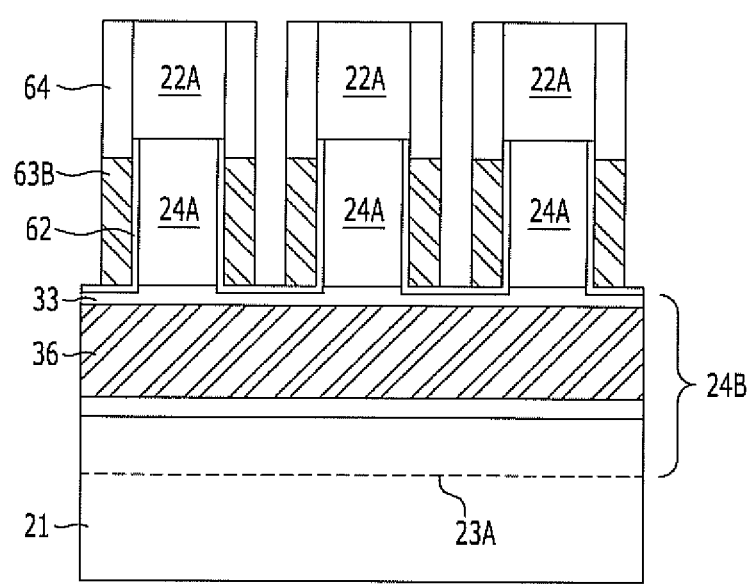

Referring to FIG. 8D, by depositing and etching back a dielectric layer, spacers 64 are formed. The spacers 64 may include a nitride layer.

The word line conductive layer 63A is etched using the spacers 64 as an etch barrier. By etching the word line conductive layer 63A, vertical word lines 63B are formed on both sidewalls of the pillars 24A. The vertical word lines 63B also serve as vertical gate electrodes. In another embodiment, the vertical word lines 63B may be formed to surround the pillars 24A. In still another embodiment, after forming annular vertical gate electrodes surrounding the pillars 24A, vertical word lines 63A may be formed in such a way as to connect adjacent vertical gate electrodes with each other. The vertical word lines 63B are formed to extend in a direction crossing with the buried bit lines 36.

Figure 8E:
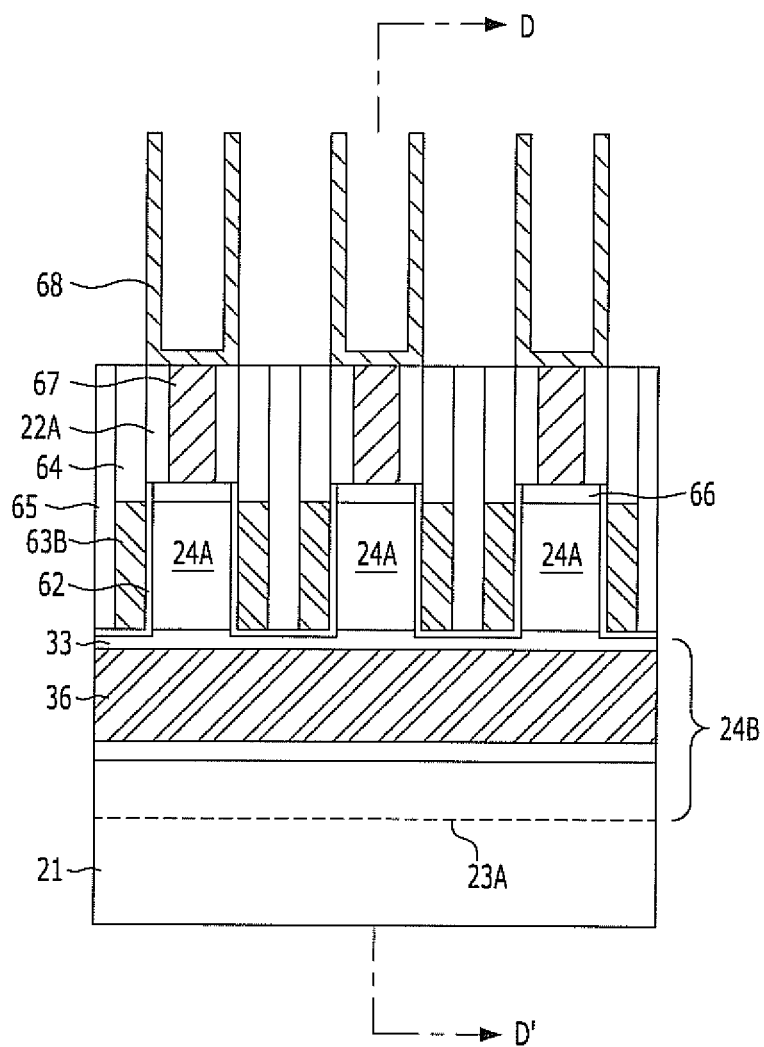

Referring to FIG. 8E, a word line isolation layer 65 for isolating the vertical word lines 63B from one another is formed. The word line isolation layer 65 includes a dielectric layer such as an oxide layer. The word line isolation layer 65 may be formed by forming a dielectric layer on the entire resultant structure formed with the vertical word lines 63B and subsequently planarizing the dielectric layer.

By performing storage node contact etching as shown in FIG. 8E, the upper surfaces of the active pillars 24A are exposed. Thereafter, storage node contact (SNC) plugs 67 are formed. Before forming the storage node contact plugs 67, second source/drain regions 66 may be formed by performing ion implantation. The second source/drain regions 66 may be formed by adopting an ion implantation method generally known in the art. Accordingly, the pillars 24A may include the second source/drain regions 66 and vertical channel regions. The vertical channel regions are formed between the first source/drain regions 33 and the second source/drain regions 66. The second source/drain regions 66 may be connected with capacitors. The first source/drain regions 33, the vertical channel regions and the second source/drain regions 66 may be connected with one another in the vertical direction through the vertical channel regions in-between. The first source/drain regions 33 and the second source/drain regions 66 may form NPN junctions or PNP junctions in cooperation with the vertical channel regions. For example, in the case where the first source/drain regions 33 and the second source/drain regions 66 are doped with impurities of a first conductivity type, the vertical channel regions may be doped with impurities of a second conductivity type opposite to the first conductivity type. Here, when the impurities of the first conductivity type are N type impurities, the impurities of the second conductivity type include P type impurities and vice versa. When the vertical channel transistors are NMOSFETs, the first source/drain regions 33, the vertical channel regions and the second source/drain regions 66 may form NPN junctions.

Capacitors are formed on the storage node contact plugs 67. The capacitors include storage nodes 68. The storage nodes 68 may have the shapes of cylinders. In another embodiment, the storage nodes 68 may have the shapes of pillars or concave structures. While not shown in the drawings, a dielectric layer and top electrodes are subsequently formed.

Figure 8F:
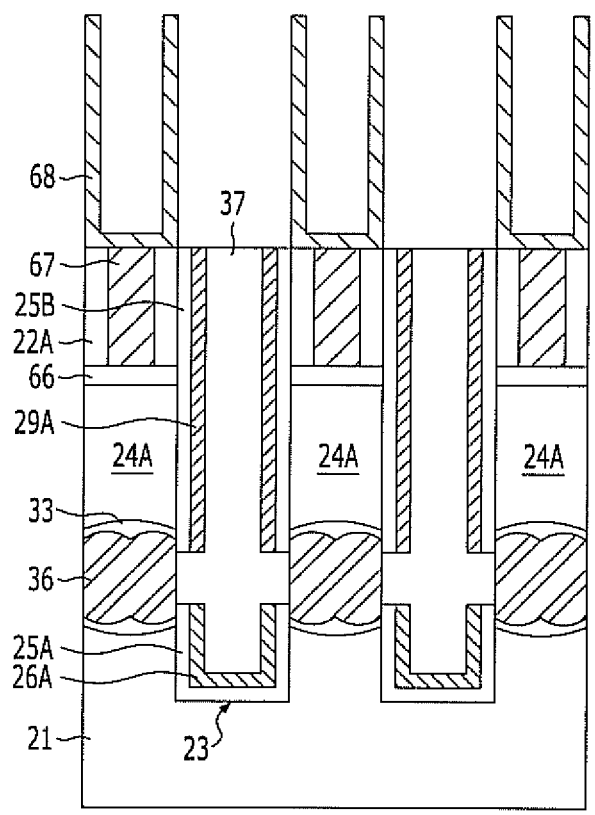
FIG. 8F is a cross-sectional view taken along the line D-D' of FIG. 8E.

FIG. 8F is a cross-sectional view taken along the line D-D' of FIG. 8E.

The semiconductor device in accordance with the embodiment of the present invention may be included in a memory cell and a memory cell array. Bit lines and word lines may store or output data on the basis of voltages applied by a column decoder and a row decoder which are connected with the memory cell array.

The memory cell array according to the embodiment of the present invention may be included in a memory device. The memory device may include a memory cell array, a row decoder, a column decoder and sense amplifiers. The row decoder selects a word line corresponding to a memory cell for which a read operation or a write operation is to be performed, among the word lines of the memory cell array, and outputs a word line select signal to the memory cell array. The column decoder selects a bit line corresponding to a memory cell for which a read operation or a write operation is to be performed, among the bit lines of the memory cell array, and outputs a bit line select signal to the memory cell array. The sense amplifiers sense the data stored in the memory cells which are selected by the row decoder and the column decoder.

The memory device according to the exemplary embodiments of the present invention may be used in a DRAM (dynamic random access memory). However, the exemplary embodiment of the present invention may also be applied to an SRAM (static random access memory), a flash memory, an FeRAM (ferroelectric random access memory), an MRAM (magnetic random access memory), a PRAM (phase change random access memory), etc.

The memory device according to the exemplary embodiments of the present invention may be applied not only to computing memories used in a desktop computer, a notebook computer and a server but also to graphics memories of various specifications and mobile memories. Also, the memory device according to the exemplary embodiments of the present invention may be provided not only in a portable storage medium such as a memory stick, an MMC, an SD, a CF, an xD picture card and a USB flash device but also in various digital applications such as an MP3P, a PMP, a digital camera, a camcorder and a mobile phone. Furthermore, the memory device according to the exemplary embodiments of the present invention may be applied not only to a single semiconductor device but also to technical fields including an MCP (multi-chip package), a DOC (disk on chip) and an embedded device. Moreover, the memory device according to the exemplary embodiments of the present invention may be applied to a CIS (CMOS image sensor) and may be provided in various fields such as of a camera phone, a web camera and a small photographing device for a medical use.

The memory device according to the exemplary embodiments of the present invention may be used in a memory module. The memory module according to the exemplary embodiments of the present invention includes a plurality of memory devices mounted to a module substrate, a command link configured to allow the memory device to receive control signals (an address signal, a command signal and a clock signal) from an external controller, and a data link connected with the memory devices and configured to transmit data. The command link and the data link may be formed similarly to those used in a general semiconductor module. In the memory module, eight memory devices may be mounted to the front surface of the module substrate, and memory devices may be mounted the same to the back surface of the module substrate. That is to say, memory devices may be mounted to one side or both sides of the module substrate, and the number of mounted memory devices is not limited. In addition, the material and the structure of the module substrate are not specifically limited.

The memory module according to the exemplary embodiments of the present invention may be used in a memory system. The memory system includes a controller which provides a bidirectional interface between at least one memory module to which a plurality of memory devices are mounted and an external system and is configured to control the operation of the memory module.

The memory system according to the exemplary embodiments of the present invention may be used in an electronic unit. The electronic unit includes a memory system and a processor electrically connected therewith. The processor includes a CPU (central processing unit), an MPU (micro processor unit), an MCU (micro controller unit), a GPU (graphics processing unit) or a DSP (digital signal processor). The CPU or MPU has a combined form of an ALU (arithmetic logic unit) as an arithmetic logic operation unit and a CU (control unit) for reading and analyzing a command and controlling respective units. When the processor is the CPU or the MPU, the electronic unit may include a computer instrument or a mobile instrument. The GPU as a CPU for graphics is a processor for calculating numbers with decimal points and showing graphics in real time. When the processor is the GPU, the electronic unit may include a graphic instrument. The DSP is a processor for converting an analog signal (for example, voice) into a digital signal at a high speed and using a calculation result or converting a digital signal into an analog signal. The DSP mainly calculates digital values. When the processor is the DSP, the electronic unit may include a sound and image instrument. Besides, the processor include an APU (accelerate processor unit) being a processor which has a combined form of CPU and GPU and includes the role of a graphic card.

As is apparent form the above descriptions, according to the exemplary embodiments of the present invention, since buried bit lines which are brought into direct contact with lower portions of pillars are formed through a double-side-contact process and a full silicidation process, parasitic capacitance between adjacent buried bit lines may be reduced, and since air gaps are defined between buried bit lines, the parasitic capacitance may be further reduced.

Furthermore, according to the exemplary embodiments of the present invention, because a metal silicide is adopted as the material of the buried bit lines, the sheet resistance (Rs) of the buried bit lines may be decreased.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
   etching a semiconductor substrate and forming a plurality of bodies separated from one another by a plurality of trenches;
   forming a protective layer with open parts to expose both sidewalls of each of the bodies;
   forming buried bit lines in the bodies by silicidizing exposed portions of the bodies through the open parts; and
   forming a dielectric layer to gap-fill the trenches and define air gaps between adjacent buried bit lines,
   wherein the forming of the buried bit lines comprises:
      forming a conductive layer on the protective layer with the open parts;
      performing annealing to cause a reaction of the conductive layer with the bodies and silicidizing of the exposed portions of the bodies through the open parts;
      forming a first dielectric layer on the conductive layer to gap-fill the trenches;
      partially etching the first dielectric layer;
      removing the conductive layer; and
      forming a second dielectric layer on the first dielectric layer to gap-fill the trenches in such a manner that the air gaps are defined between the adjacent buried bit lines.

2. The method of claim 1, wherein the first dielectric layer and the second dielectric layer comprise oxide layers.

3. The method of claim 1, wherein the forming of the protective layer with the open parts comprises:
   forming a first protective layer on an entire surface of the etched semiconductor substrate including the bodies;
   forming a second protective layer on the first protective layer;
   forming a first sacrificial layer on the second protective layer to gap-fill the trenches;
   partially etching the first sacrificial layer and the second protective layer;
   forming a second sacrificial layer on the recessed second protective layer and the recessed first sacrificial layer to gap-fill the trenches;
   partially etching the second sacrificial layer;
   forming a third protective layer as spacers to cover the first protective layer exposed by the partially etched second protective layer;
   forming preliminary open parts by selectively removing the partially etched first and second sacrificial layers; and
   selectively removing the first protective layer exposed by the preliminary open parts.

4. The method of claim 3, wherein the second protective layer and the third protective layer comprise nitride layers, and the first sacrificial layer and the second sacrificial layer comprise polysilicon layers.

5. The method of claim 3, wherein the first protective layer comprises an oxide layer, and the second protective layer and the third protective layer comprise nitride layers.

* * * * *

UNITED STATES PATENT AND TRADEMARK OFFICE
CERTIFICATE OF CORRECTION

PATENT NO. : 9,837,422 B2
APPLICATION NO. : 15/179809
DATED : December 5, 2017
INVENTOR(S) : You-Song Kim et al.

Page 1 of 1

It is certified that error appears in the above-identified patent and that said Letters Patent is hereby corrected as shown below:

On the Title Page

Change the OTHER PUBLICATIONS section as follows:
Office Action issued by the State Intellectual Property Office (China Patent Office) dated May 5, 2016.

Signed and Sealed this
Ninth Day of January, 2018

Joseph Matal
*Performing the Functions and Duties of the*
*Under Secretary of Commerce for Intellectual Property and*
*Director of the United States Patent and Trademark Office*